United States Patent
Chambers

(10) Patent No.: US 7,489,009 B2
(45) Date of Patent: Feb. 10, 2009

(54) MULTIPLE-GATE MOSFET DEVICE WITH LITHOGRAPHY INDEPENDENT SILICON BODY THICKNESS

(75) Inventor: James Joseph Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 409 days.

(21) Appl. No.: 11/124,942

(22) Filed: May 10, 2005

(65) Prior Publication Data

US 2005/0263832 A1   Dec. 1, 2005

Related U.S. Application Data

(62) Division of application No. 10/696,130, filed on Oct. 29, 2003, now Pat. No. 6,946,377.

(51) Int. Cl.
*H01L 29/76* (2006.01)
(52) U.S. Cl. .............. 257/401; 257/250; 257/331; 257/368; 257/E21.426; 257/E21.442; 257/E29.275
(58) Field of Classification Search ........... 257/250, 257/331, 368, 401, E21.426, E21.442, E29.275
See application file for complete search history.

(56) References Cited

U.S. PATENT DOCUMENTS

| | | | |
|---|---|---|---|
| 5,804,848 A | 9/1998 | Mukai | |
| 5,899,710 A | 5/1999 | Mukai | |
| 6,064,107 A | 5/2000 | Yeh et al. .................. 257/522 |
| 6,344,397 B1 | 2/2002 | Horstmann et al. ......... 438/300 |
| 6,396,108 B1 | 5/2002 | Krivokapic et al. ......... 257/365 |
| 6,525,403 B2* | 2/2003 | Inaba et al. .................. 257/618 |
| 6,559,051 B1 | 5/2003 | Buynoski et al. ............ 438/678 |
| 6,583,012 B1 | 6/2003 | Buynoski et al. ............ 438/275 |
| 2002/0011612 A1* | 1/2002 | Hieda ........................ 257/262 |
| 2002/0036290 A1* | 3/2002 | Inaba et al. .................. 257/66 |

(Continued)

OTHER PUBLICATIONS

"25nm CMOS Omega FETs", IEEE, Fu-Liang Yang, Hao-Yu Chen, Fang-Cheng Chen, Chang-Chuan Huang, Chang-Yun Chang, Hsien-Krang Chiu, Chi-Chuang Lee, Chi-Chun Chen, Huan-Tsuang Huang, Chih-Jian Chen Hun-Jan Tao, Yee-Chia Yeo, Mong-Song Liang and Chenming Hu, 2002, 4 pgs.

(Continued)

*Primary Examiner*—Andy Huynh
(74) *Attorney, Agent, or Firm*—Wade J. Brady, III; Frederick J. Telecky, Jr.

(57) ABSTRACT

Multi-gate MOS transistors and fabrication methods are described, in which the transistor semiconductor body thickness or width is lithography independent, allowing scaled triple and quad-gate devices having semiconductor bodies smaller than a lateral gate length dimension. A form structure is provided over a semiconductor wafer starting structure, and spacers are formed along one or more sidewalls of an opening in the form structure. A semiconductor material is deposited in the opening by epitaxial growth or other deposition process, and the form structure and the spacer are removed. A gate structure is then formed along the top and sides of a central portion of the formed semiconductor body. The spacer may be L-shaped, providing an undercut or recess at the bottom of the semiconductor body sidewall, and the gate may be formed in the undercut area to allow fabrication of more than three gates.

9 Claims, 32 Drawing Sheets

U.S. PATENT DOCUMENTS

| | | | |
|---|---|---|---|
| 2003/0136963 A1 | 7/2003 | Krivokapic et al. | |
| 2004/0036126 A1* | 2/2004 | Chau et al. | 257/401 |
| 2004/0217420 A1 | 11/2004 | Yeo et al. | 257/347 |
| 2005/0051812 A1 | 3/2005 | Dixit et al. | 257/250 |

OTHER PUBLICATIONS

"SOI Devices for Sub-0.1 μm Gate Lengths", Proc. 23$^{rd}$ International Conference on Microelectronics (Miel 2002), vol. 1, NIS, Yugoslavia, May 12-15, 2002, J.P. Colinge, J.T. Park and C.A. Colinge, pp. 109-113.

"Advanced Depleted-Substrate Transistors: Single-Gate, Double-Gate and Tri-Gate", 2002 International Conference on Solid State Devices and Materials (SSDM 2002, Nagoya, Japan, Robert Chau, Brian Doyle, Jack Kavalieros, Douglas Barlage, Anand Murthy, Mark Doczy, Rafail Rios, Tom Linton, Reza Arghavani, Ben Jin, Suman Datta and Scott Hareland, pp. 1-23.

"Beyond the Conventional Transistor", IBM J. Res. & Diev., vol. 46, No. 2/3, Mar./May 2002, H.-S.P. Wong, pp. 133-168.

* cited by examiner

MULTIPLE-GATE MOSFET DEVICE WITH LITHOGRAPHY INDEPENDENT SILICON BODY THICKNESS

This application is a division of Ser. No. 10/696,130, filed Oct. 29, 2003, now U.S. Pat. No. 6,946,377, and claims priority under 35 U.S.C. 120.

RELATED APPLICATIONS

This application is related to U.S. patent application Ser. No. 10/696,539, filed on Oct. 23, 2003, entitled TRIPLE GATE MOSFET TRANSISTOR AND METHODS FOR FABRICATING THE SAME.

FIELD OF INVENTION

The present invention relates generally to semiconductor devices and more particularly to multiple-gate MOSFET transistors with lithography independent silicon body thickness and fabrication methods therefor.

BACKGROUND OF THE INVENTION

Metal-oxide-semiconductor field-effect transistors (MOSFETs) are widely used in the electronics industry for switching, amplification, filtering, and other tasks related to both analog and digital electrical signals. Conventional planar MOS transistors include a gate dielectric overlying a channel region at the upper surface of a silicon substrate and a gate electrode situated above the gate dielectric. Source and drain regions are formed in the substrate on either lateral side of the channel. In operation, the gate electrode is energized to create an electric field in the channel region of the substrate, thus inverting a thin portion of the channel conductive underneath the gate dielectric and allowing minority carriers to travel through the channel between the source/drains. The threshold voltage (Vt) of a transistor is the gate voltage value required to render the channel conductive by formation of an inversion layer (e.g., in which the concentration of minority carriers exceeds that of majority carriers) at the surface of the semiconductor channel under the gate.

Scaling is a continuing process in the manufacture and design of semiconductor products, wherein electrical device feature sizes are being reduced to increase device density, improve performance (e.g., increase switching speed), and to reduce power consumption. For instance, it is desirable to scale or reduce the length of the transistor gate and hence the length of the channel between the source/drains, to increase drive current performance, particularly for operation with reduced gate voltages. The length of the gate structure is typically the smallest dimension in a planar transistor. However, lithography generally limits the extent to which transistor dimensions can be reliably scaled, wherein the minimum gate length is typically limited to the smallest dimension that can be reliably and repeatably patterned and etched using current photolithographic and etching techniques.

In addition to fabrication process limitations, performance limitations are also a barrier to scaling conventional planar transistor dimensions, particularly the gate length. For example, as the gate length is reduced, the transistor performance may be inhibited by short channel effects. In devices having long channel lengths, the gate voltage and the resulting field primarily control the depletion of charge under the gate. In shorter channel devices, however, the channel region is also affected by the source and drain voltages, leading to increased off-state current due to Vt roll off, degraded sub-threshold slope, and degraded output current. In addition, since less gate voltage is needed to deplete the shortened channel, the barrier for electron injection from the source to the drain decreases, a situation sometimes referred to as drain induced barrier lowering (DIBL).

As the performance and process limitations on scaling planar transistors are reached, attention has been recently directed to transistor designs having multiple gates (e.g., non-planar MOS transistors). In theory, these designs provide more control over a scaled channel by situating the gate around two or more sides of the channel silicon, wherein a shorter channel length can be achieved for the same gate dielectric thickness or similar channel lengths can be used with thicker gate dielectrics. FIGS. 10A and 10B illustrate examples of some multiple-gate transistor designs, including dual and triple-gate transistors 60 and 62, respectively in FIG. 10A, as well as a quad-gate transistor 64, and a "PI"-gate transistor 66 in FIG. 10B, formed in a silicon over insulator (SOI) wafer 68. In conventional multi-gate devices, an SOI wafer is provided, which includes a substrate with an overlying oxide insulator and a 20.0-50.0 nm thick semiconductor layer above the oxide. The upper silicon layer is etched away, leaving isolated islands or blocks of silicon, and a gate is formed around the silicon blocks, with the ends of the blocks being doped to form source/drains, as illustrated in FIGS. 10A and 10B.

Multi-gate designs offer the prospect of improved transistor performance by alleviating the short channel effects seen in scaled planar transistors. This is due primarily to the ability to invert a larger portion of the channel silicon because the gate extends on more than one peripheral side of the channel. In practice, however, the conventional multi-gate approaches have suffered from cost and performance shortcomings, because SOI wafers are more expensive than ordinary silicon substrates and because the channel surface has been etched while carving the upper SOI silicon layer into islands or blocks. Accordingly, there remains a need for improved transistor devices and manufacturing techniques to realize the advantages of scaling while mitigating or avoiding short channel effects and the shortcomings of traditional multi-gate transistors.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

The invention relates to triple-gate and other multi-gate MOS transistors and methods for fabricating such transistors, in which the transistors are constructed from a semiconductor body formed above a starting structure using a form structure or mold and spacers, rather than by etching into an SOI wafer. This allows control over channel dimensions independent of lithography limitations and avoidance or mitigation of the adverse effects of etched channel surfaces, while attaining the advantages of multi-gate devices (e.g., inversion of more channel silicon, reduction in short channel effects, reduced DIBL, etc.), using less expensive starting structures (e.g., silicon wafers, etc.). In addition, the spacers may be formed (e.g., L-shaped) so as to create an undercut or re-entrant cavity at the bottom of the formed semiconductor body. The gate structure can be formed to extend within the undercut recess, thus providing for quadruple-gate or 3.5-gate transistors having semiconductor bodies smaller than a lithographically patterned gate length dimension. In one example, a form structure is provided over a semiconductor wafer with an opening exposing a portion of the wafer. A spacer is formed along sidewalls of the opening and semiconductor material is deposited in the opening by epitaxial growth, and the form structure and the spacer are then removed. A gate structure is thereafter formed along the top and sides of a central portion of the formed semiconductor body. The spacer may be L-shaped, providing an undercut or recess at the bottom of the semiconductor body sidewall, and the gate may extend into the undercut area to underlie a portion of the resulting transistor channel.

In one aspect of the invention, a method is provided for fabricating MOS transistors, comprising creating a form structure having an opening exposing a single portion an underlying starting structure, and forming a spacer in the opening of the form structure, where the spacer extends over part of the starting structure along a sidewall of the form structure opening. The method further includes forming a semiconductor material in the opening to create a formed semiconductor body having a single generally planar bottom surface overlying the starting structure. The form structure and the spacer are then removed, a gate structure is formed along at least a portion of a top and sides of the semiconductor body, and portions of the formed semiconductor body are doped to form source/drains.

The spacer may be formed by depositing a spacer material layer, such as silicon nitride (e.g., $Si_3N_4$) over the form structure and over the exposed starting structure, such as by chemical vapor deposition (CVD), atomic layer deposition (ALD), or other generally conformal deposition process. Thereafter, the spacer material layer is etched to expose a portion of the starting structure, leaving a portion of the spacer material layer extending over part of the starting structure along the sidewall of the opening. Following formation of the semiconductor body, the form structure and the spacer may be removed by wet etching the form structure and the spacer or other isotropic material removal technique, leaving the formed semiconductor body having a single bottom surface above the starting structure. In another implementation, the spacer formation comprises depositing a first spacer material layer (e.g., silicon nitride) over the form structure and over the exposed starting structure, and depositing a second spacer material layer (e.g., $SiO_2$) over the first spacer material layer. The spacer material layers are then etched, leaving a generally L-shaped portion of the first spacer material layer extending over part of the starting structure along the sidewall of the form structure opening.

In another aspect of the invention, transistors are provided, comprising a semiconductor body with first, second, and third body portions individually comprising a generally planar first bottom surface overlying a starting structure, where the first and third body portions individually comprise doped source/drains. The second body portion comprises a top, first and second sides extending laterally between the first and third body portions, and a lithography independent width between the first and second sides. A gate structure having a lateral gate length is situated along the top and sides of the second body portion, including a conductive gate electrode and a gate dielectric disposed between the gate electrode and the second body portion. In one implementation, the gate length is about 25 nm or less and the lithography independent width of the second body portion is less than the gate length, for example, less than one half of the lateral gate length, such as about one third of the lateral gate length.

According to another aspect of the invention, a transistor is provided, comprising a semiconductor body with first, second, and third body portions individually comprising a planar bottom surface overlying a semiconductor starting structure, where the first and third body portions comprise doped source/drains. The second body portion comprises a second bottom surface spaced from the starting structure, together with a top and sides extending laterally between the first and third body portions. A gate structure is provided along the top and sides of the second body portion and along at least a portion of the second bottom surface between the second body portion and the starting structure.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
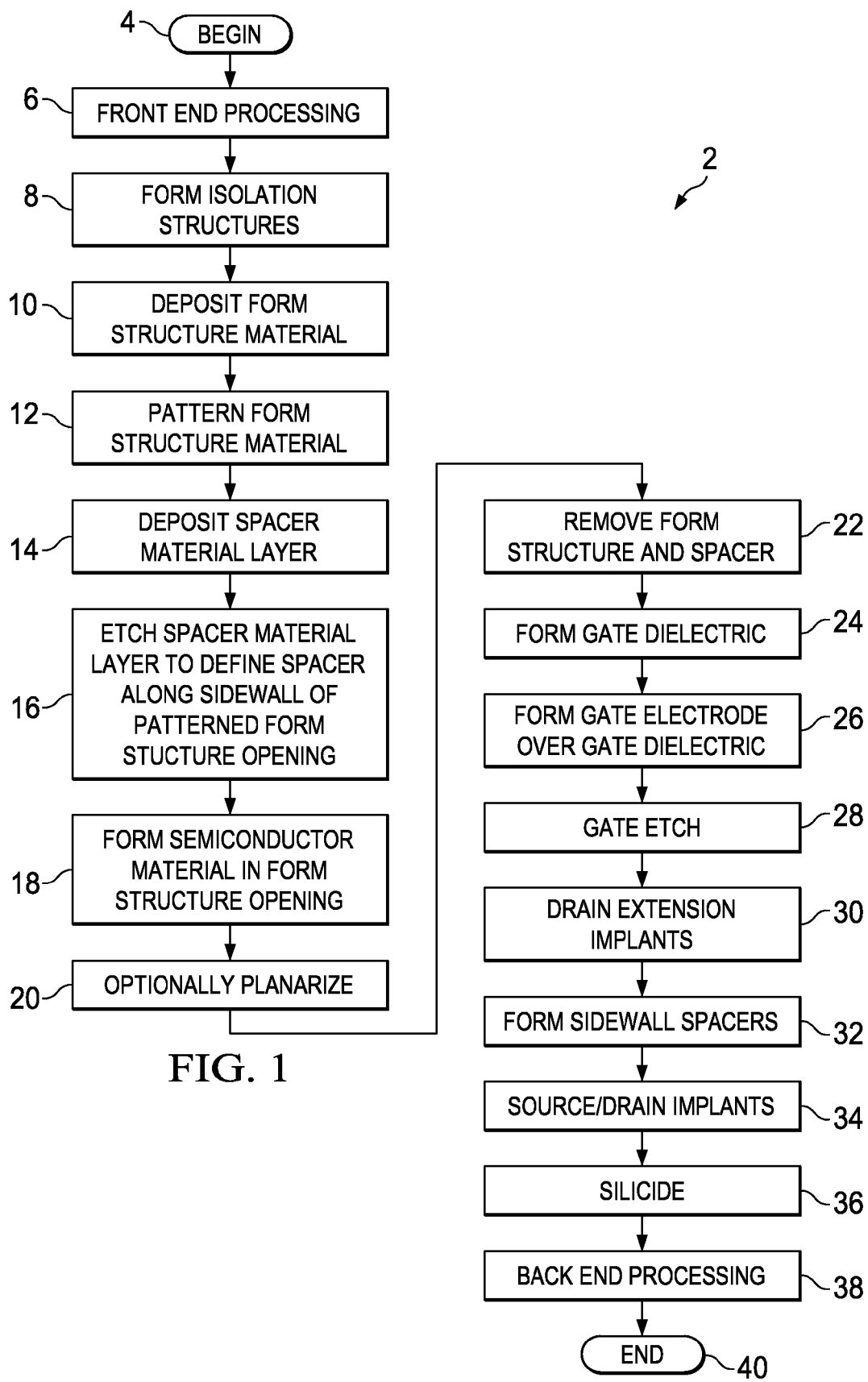
FIG. 1 is a flow diagram illustrating an exemplary method for fabricating a multiple-gate MOS transistor with a lithography independent silicon body thickness in accordance with an aspect of the present invention.

The present invention will now be described with reference to the attached drawing figures, wherein like reference numerals are used to refer to like elements throughout, and wherein the illustrated structures and devices are not necessarily drawn to scale. The invention relates to transistor devices and fabrication methods wherein a semiconductor body is provided over a starting structure with a semiconductor body dimension that is independent of lithography technology limitations. This allows tuning or optimization of transistor performance, including improved volume inversion in a multi-gate transistor channel, wherein the semiconductor body or thickness can be made smaller than the device gate length, for example, less than half the gate length.

In the examples illustrated and described below, the semiconductor body is formed in a cavity of a temporary form structure having spacers therein, through deposition of epitaxial silicon or other semiconductor material, whereafter the form structure and the spacer are removed and a gate structure is formed. The device features and structures of the invention having lithography independent dimensions, including the semiconductor body dimensions, include any dimension smaller than the smallest feature size that can be fabricated using lithography techniques (e.g., photolithographically patterned masks used with etch processes to define device features or structures). In this regard, transistor structures and semiconductor bodies therefor can be fabricated using the illustrated spacer techniques or other processes within the scope of the present invention.

FIG. 1 presents an exemplary method 2 for fabricating a transistor in accordance with the present invention. Although the exemplary method 2 and the other methods illustrated herein are depicted and described below as a series of acts or events, the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein (e.g., device 100 in FIGS. 2A-10C below) as well as in association with other structures and devices not illustrated.

The method 2 begins at 4, and front end processing is performed at 6, for example, including formation of wells and any other initial processing of a semiconductor substrate, SOI wafer, or other starting structure. Isolation structures are formed at 8 in field regions of the starting structure, for example using $SiO_2$ field oxide or other suitable isolating materials, which may be fabricated by local oxidation of silicon (LOCOS), shallow trench isolation (STI), or other suitable techniques.

At 10 and 12, a form structure is created for use in forming a semiconductor material structure (e.g., a formed semiconductor body) above the starting structure. As illustrated and described below with respect to FIGS. 3A-3C, the form structure may be formed directly over the starting structure and the isolation structures thereof, to cover the isolation structures, and to expose a single portion of the starting structure (e.g., silicon substrate) through an opening in which a semiconductor body will be formed. The form structure may be created using any suitable materials by any fabrication techniques within the scope of the invention. In the exemplary method 2, form structure material is deposited at 10 as a layer over the starting structure and over the isolation structures by chemical vapor deposition (CVD), atomic layer deposition (ALD), or other deposition process, to a thickness generally corresponding to a desired final transistor gate length. At 12, the deposited form layer material is selectively patterned using suitable masking and etching techniques (e.g., reactive ion etching (RIE)), leaving an opening through which a single portion of the starting structure is exposed for the transistor semiconductor body. A thin protective etch-stop layer may optionally be deposited over the starting structure and isolation structures (e.g., $SiO_2$ layer having a thickness of about 50 Å or less) prior to creation of the form structure at 10, to protect the starting structure during patterning of the form structure at 12, which is then removed following the etching at 12.

One aspect of the invention provides for creating a semiconductor body having one or more structural dimensions that are independent of lithography limitations. In the method 2, a spacer is formed at 14 and 16 extending over part of the starting structure along a sidewall of the form structure opening. At 14, a spacer material layer is deposited over the form structure and over the exposed starting structure using CVD, ALD, or other suitable deposition process to form a generally conformal layer. The spacer material layer may be any suitable material, for example silicon nitride ($Si_3N_4$), silicon dioxide ($SiO_2$), etc. The spacer material layer is then etched at 16 to expose a portion of the starting structure, leaving a portion of the spacer material layer extending over part of the starting structure along the sidewall of the form structure opening. The etching at 16 may be any suitable material removal process, preferably RIE or other anisotropic etching, so that a spacer is defined along the sidewalls of the form structure opening without the need for masking.

In this manner, the form structure opening is effectively reduced in size, wherein some or all of the opening dimensions (e.g., width) may be reduced beyond the smallest dimension that could be formed through lithographic techniques. This may be advantageously employed in constructing a channel portion of the formed semiconductor body having a vertical depth roughly the same as the subsequently patterned gate length and a lateral semiconductor body width that is less than the gate length. In this regard, the exemplary devices illustrated and described below comprise a channel depth that is generally dependent on the deposition thickness of the form layer (e.g., discounted by the amount of form layer material removed during any subsequent planarization at 20), a gate length that is dependent upon lithography process limitations, and a semiconductor body that is lithography independent. For example, in the device 100 below (FIGS. 2A-10C), the semiconductor body may be made less than about one half the gate length, such as about one third of the gate length dimension.

Once the form structure and spacer have been formed, a semiconductor body is then created (e.g., formed) at 18 and 20 in the form structure opening using any suitable semiconductor materials and processing steps. In the exemplary implementation, a semiconductor material is formed at 18 in the opening of the patterned form layer material, for example, by epitaxial growth of silicon (Si), silicon germanium (SiGe), germanium (Ge), gallium arsenide (GaAs), or other suitable semiconductor material. The epitaxial silicon can be formed in the opening in a variety of ways within the scope of the invention. The epitaxial growth can be performed either selectively or non-selectively to the exposed substrate. In the illustrated implementation, the epitaxial silicon is deposited at 18 selectively to the semiconductor substrate starting structure within the opening of the form structure. In another possible approach, a non-selective epitaxial deposition is performed, wherein epitaxial silicon is formed at 18 over the starting structure and in the form opening, after which the wafer is planarized at 20. In another possible implementation, a selective deposition can be terminated once the top of the form layer is reached, followed by a non-selective deposition that deposits both on the semiconductor body and the form layer, after which the device is planarized at 20.

An optional surface preparation step may be performed, such as a wet clean operation, before epitaxial deposition or in-situ as part of an epitaxial deposition process at 18 to heal any damage to the substrate surface, to remove any absorbed debris, and to remove any optional $SiO_2$ etch-stop layer material remaining over the starting structure material. The epitaxial deposition at 18 may also include a combination of etching of the underlying silicon starting structure and deposition of newly formed epitaxial silicon, wherein the pre-existing starting structure silicon may be initially etched slightly prior to beginning deposition of new material, by which damage caused by patterning the form structure may be repaired.

After deposition of the semiconductor body material, if needed, the wafer can optionally be planarized at 20, for example, by chemical mechanical polishing (CMP) or other suitable technique. This leaves a generally planar structure having the form structure material exposed with the semiconductor body structure in the form structure opening above the starting material. The form structure material and the spacer are then removed at 22, for example, by selective etching, or other suitable material removal technique, leaving the formed semiconductor body above the starting structure. In a preferred implementation, wet etching is employed at 22 to mitigate damage to the top and sides of the formed semiconductor body, for example, a wet etch process using a phosphoric acid wet clean which is selective both to a silicon formed semiconductor body and any optional $SiO_2$ etch-stop layer material that was previously deposited under the form layer.

This leaves a formed semiconductor body that comprises first, second, and third body portions, wherein the second body portion extends between the first and third body portions and has first and second sides and a top. Because the spacer was employed in the form structure opening, one or more dimensions of the formed semiconductor body are lithography independent, wherein the second body portion has a lateral width dimension that can be made smaller than the length dimension of a subsequently patterned gate structure. This lithography independent control over the semiconductor body dimensions allows optimization of multi-gate MOS transistor device performance, including improved volume inversion in a triple-gate device.

A gate structure is formed at 24-28 along a portion of a top and sides of the formed semiconductor body, having a conductive gate electrode and a gate dielectric disposed between the gate electrode and the formed semiconductor body. A gate dielectric is formed at 24, for example, a thin $SiO_2$, SiON, high-k, or other suitable dielectric material, formed by a thermal oxidation process, a deposition process, or other suitable technique. The gate dielectric material is formed over the side and upper surfaces of the formed semiconductor body. A gate electrode material layer (e.g., polysilicon, metal, or other suitable material) is then deposited at 26 over the gate dielectric along the top and sides of the semiconductor body. The gate dielectric and gate electrode layers may be formed to any suitable thickness at 24 and 26, respectively, using any suitable growth/deposition processes within the scope of the invention. At 28, a gate etch is performed to selectively remove portions of the gate electrode material, which may also remove portions of the gate dielectric material as well. Any suitable masking and etching processes may be employed at 28 (e.g., reactive ion etching using a lithographically created etch mask, or lithography independent material removal processes, etc.) to pattern the gate layers, thereby defining a patterned transistor gate structure.

In the exemplary device 100 illustrated and described in FIGS. 2A-10C below, the gate structure includes multiple gate segments or portions extending along portions of the top and lateral sides of the second body portion of the formed semiconductor body. In this case, all or a part of the covered portion of the formed semiconductor body will operate as a transistor channel, and part or all of the first and third body portions will be doped to operate as source/drains in the completed transistor device. It is noted at this point that the use of spacers in the form structure allows the semiconductor body dimension to be adjusted beyond the limits of a particular lithography process, wherein the semiconductor body can be smaller than the gate length dimension, even for a scaled gate length device.

At 30, a shallow drain extension dopant implantation is performed to provide dopants in source/drain portions of the formed semiconductor body (e.g., in the first and third body portions). The drain extension implant at 30 may also provide dopants to the gate electrode, for example, where the electrode is polysilicon, to render the gate electrode conductive. The patterned gate structure and the semiconductor body may then be encapsulated, for example, via a reoxidation (RE-OX) process that oxidizes the exposed semiconductor surfaces thereof or via other suitable encapsulation materials and processes. At 32, sidewall spacers are formed along the sidewalls of the encapsulated gate structure and the sidewalls of the formed semiconductor body, and a source/drain implant is performed at 34 to further dope the source/drain portions. The source/drain implant and/or the drain-extension implant operations at 30 and 34 may be angled implants to fully define the source/drain regions of the formed semiconductor body.

Metal silicide gate and source/drain contacts are then formed through silicide processing at 36 to provide a metal silicide gate contact above the gate electrode as well as source/drain suicide contacts over the source/drains, for example, by deposition of nickel over the device and annealing, followed by removal of unreacted nickel. Back end processing, including metalization is then performed at 38 to complete the device fabrication processing before the method 2 ends at 40.

Figure 2A:
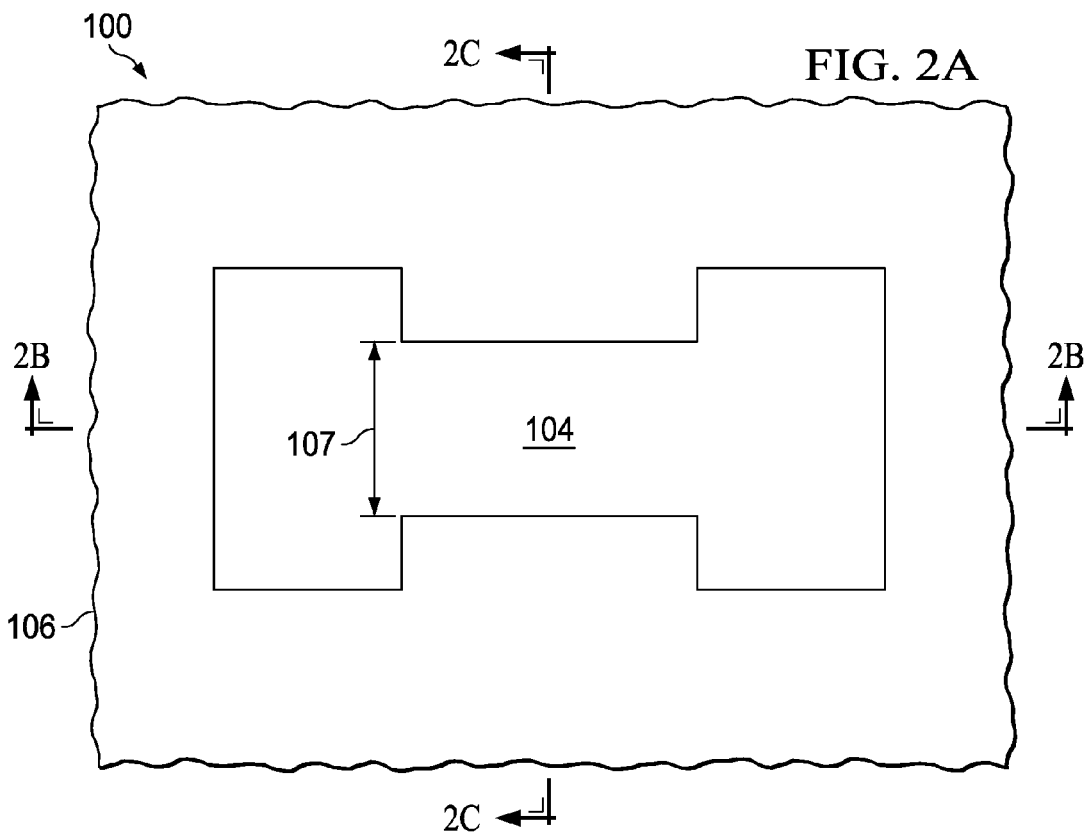
FIGS. 2A-10C are partial top plan and side elevation views in section illustrating a portion of a semiconductor device with an exemplary triple-gate MOSFET device in accordance with the invention, shown at various stages of fabrication processing.
Figure 2B:
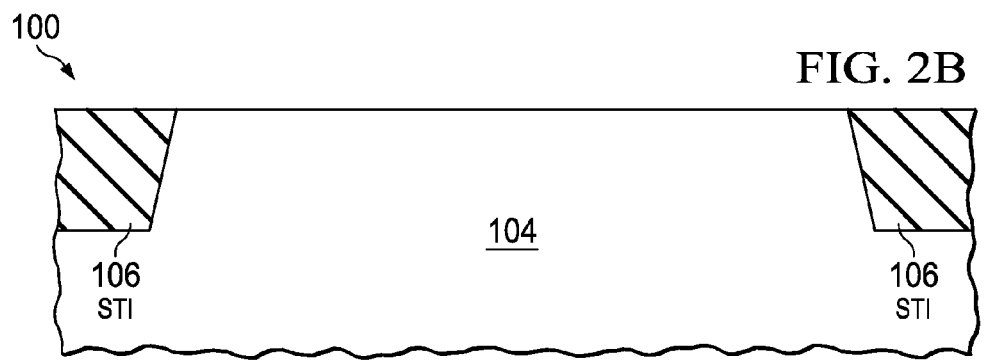
Figure 2C:
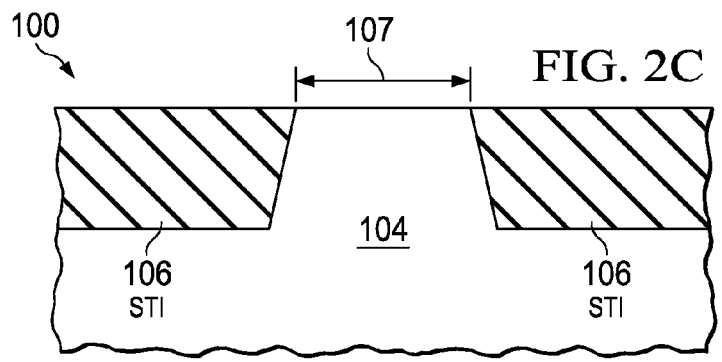

Referring now to FIGS. 2A-9C, an exemplary triple-gate MOS transistor is illustrated in a semiconductor device 100 in accordance with the invention, undergoing processing at various stages of fabrication. In this example, FIGS. 2A, 3A, 4A, 5A, 6A, 7A, 8A, 9A, and 10A illustrate sectional top plan views of the device 100 and the other figures are side and end views as shown by the sections lines in the corresponding plan views. The device 100 is illustrated undergoing fabrication processing generally in accordance with the method 2 described above, although transistors of the present invention may be fabricated by other methods. As shown in FIGS. 2A-2C, the device 100 comprises a silicon substrate 104 starting structure and $SiO_2$ STI isolation structures 106 formed in field regions of the substrate 104. The isolation structures 106 are fabricated around the periphery of an "H"-shaped portion of the starting structure 104, as illustrated in the top plan view of FIG. 2A. The central portion of the H-shape has a width 107 generally corresponding to a desired gate length for the triple-gated transistor to be formed thereover.

Figure 3A:
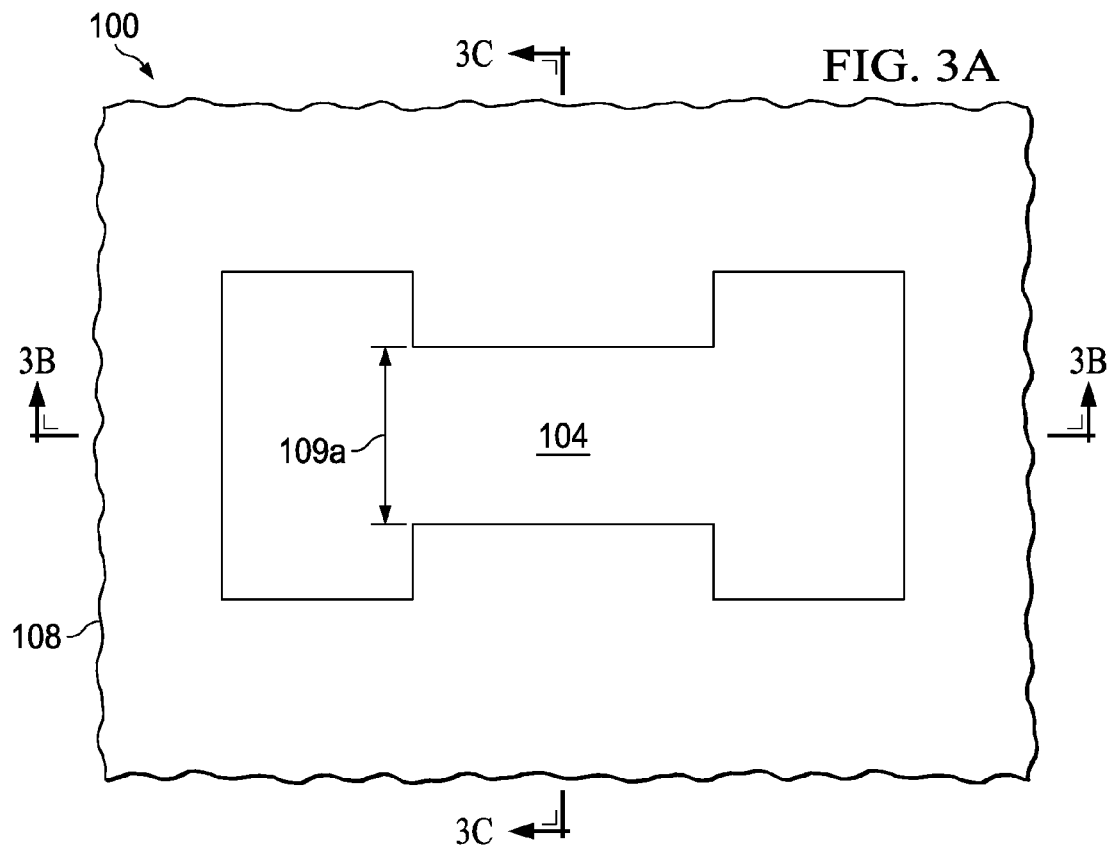
Figure 3B:
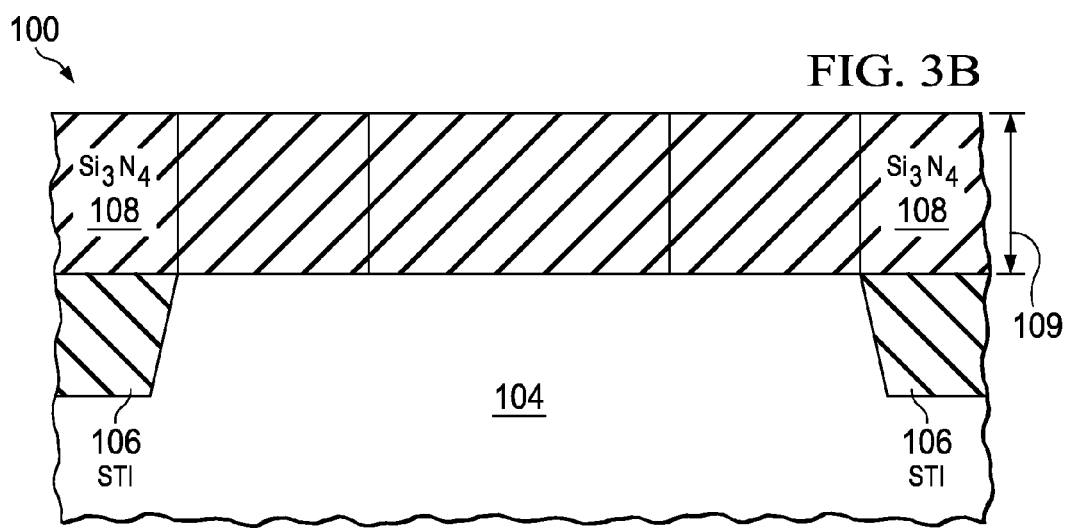
Figure 3C:
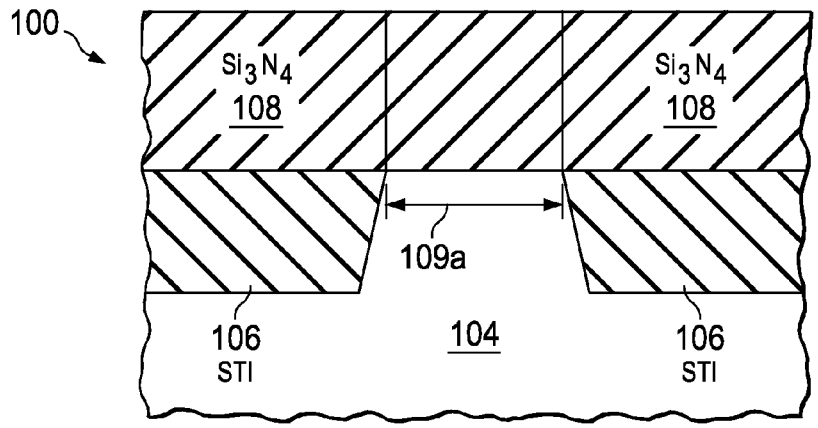

A silicon nitride (e.g., $Si_3N_4$) form structure 108 is created in FIGS. 3A-3C above the substrate 104, which is generally aligned with the underlying STI structures 106. The form structure 108 may be created using any suitable materials by any fabrication techniques within the scope of the invention. In the illustrated implementation, silicon nitride (e.g., $Si_3N_4$) or other suitable material 108 is deposited over the substrate 104 and over the isolation structures 106 by chemical vapor deposition (CVD), atomic layer deposition (ALD), or other deposition process. The material 108 can be formed to any thickness 109, for example, where the deposition thickness 109 is generally the same as the desired final transistor gate length (e.g., about 25 nm or less in one example). The form layer material 108 is then selectively patterned, using suitable masking and etching techniques, leaving an opening through which a single contiguous portion of the starting structure 104 is exposed. Although the patterned form structure 108 is aligned with the isolation structure 106 in the exemplary device 100, alternative implementations are possible wherein the isolation structure 106 and the temporary form structure 108 do not correspond with one another or are not strictly aligned. In the device 100, the patterned form structure 108 includes an "H"-shaped cavity or opening exposing the "H"-shaped portion of the substrate 104, where the central portion of the opening has a width 109a generally equal to the thickness 109 and to the desired final transistor gate length. Other form structure opening shapes are possible within the scope of the invention, wherein the illustrated "H" shape advantageously provides reasonable semiconductor length, width, and depth dimensions for the resulting transistor channel, while also providing sufficient contact area for the source/drains thereof. However, the opening and the resulting formed semiconductor body may be of any shape within the scope of the invention, for example, including but not limited to rectangles, squares, etc.

Figure 3D:
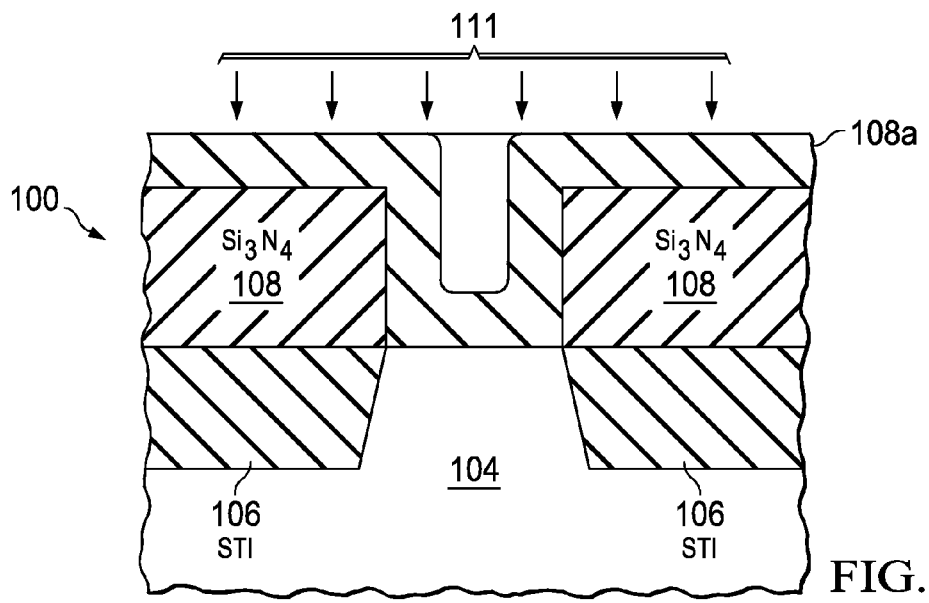
Figure 3E:
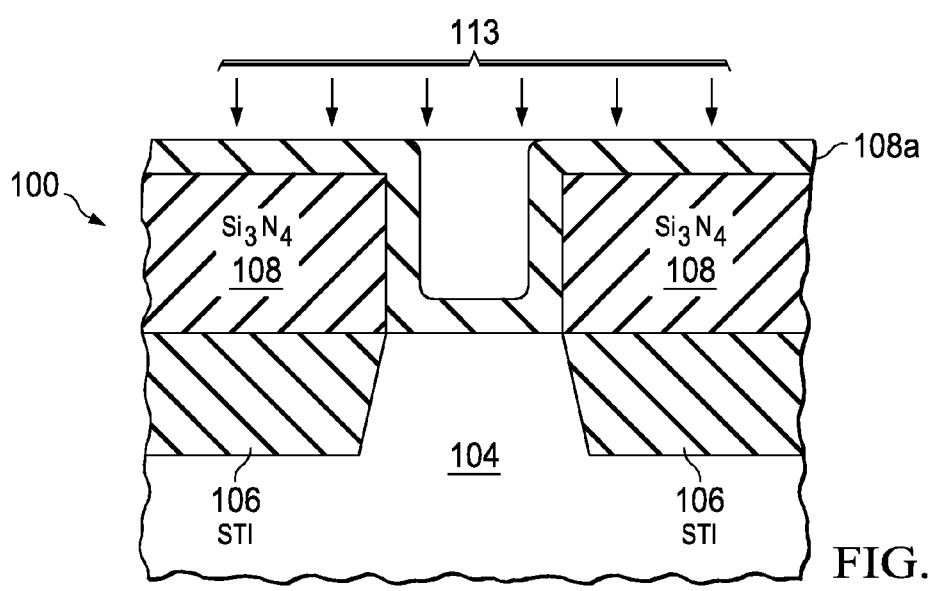
Figure 3F:
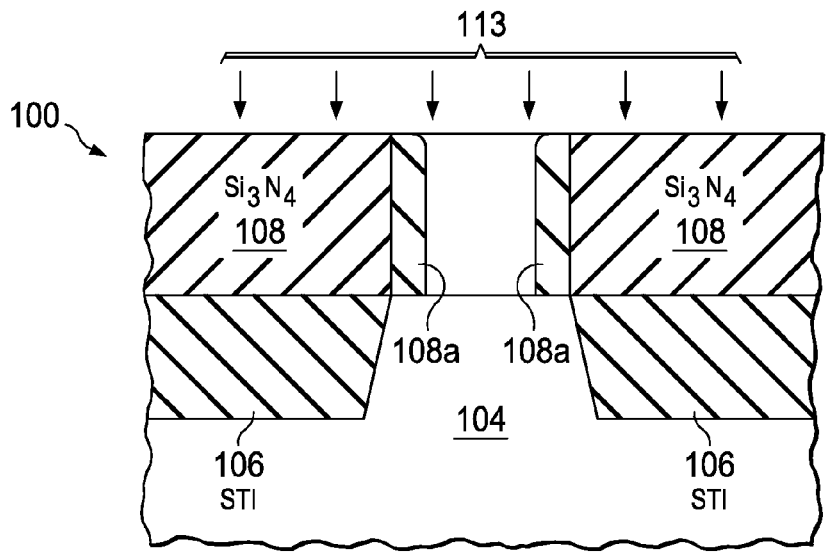

A spacer 108a is then formed in FIGS. 3D-3F along the sidewalls of the form structure opening above the substrate 104. In FIG. 3D, a spacer material layer 108a is deposited over the form structure 108 and over the exposed starting structure 104 via a CVD deposition process 111. The spacer material layer may be any suitable material, for example silicon nitride ($Si_3N_4$), silicon dioxide ($SiO_2$), etc. An anisotropic RIE etch process 113 is then performed in FIGS. 3E and 3F to remove the thinner portions of the spacer material 108a, leaving spacers 108a along the sidewalls in the opening of the form structure 108 as shown in FIG. 3F. In the illustrated fabrication example, the conformality and thickness of the deposited spacer material layer 108a, the anisotropic nature and duration of the etch process 113, and the height of the form structure 108 play a role in the lateral thickness of the finished spacers 108a, which are further illustrated in FIGS. 4A-4E.

In the illustrated example, the deposition thickness 109 (FIG. 3B) of the form structure 108 is generally equal to the gate length for the transistor. The deposition thickness of the spacer layer 108a, and the duration of the etch process 113 are tailored to provide a lateral width 109b (FIG. 4C) of the central portion of the H-shaped form structure/spacer opening that is less than the eventual transistor gate length. This lateral width 109b will subsequently determine the semiconductor body of the triple-gate transistor (e.g., width $110_W$ in FIG. 5C below), whereas lithography limitations dictate the minimum patterned gate length of the transistor (e.g., gate length $114_L$ in FIGS. 8A and 8B below). The lithography independent width of the structure/spacer opening and hence the eventual semiconductor body can be made about one half of the gate length or less (e.g., width 109c in FIG. 4D), for example, about one third of the gate length (e.g., width 109d in FIG. 4E). Any form structure thickness 109 may be used and the spacer 108a may be constructed using other materials and formation techniques within the scope of the invention.

Figure 5A:
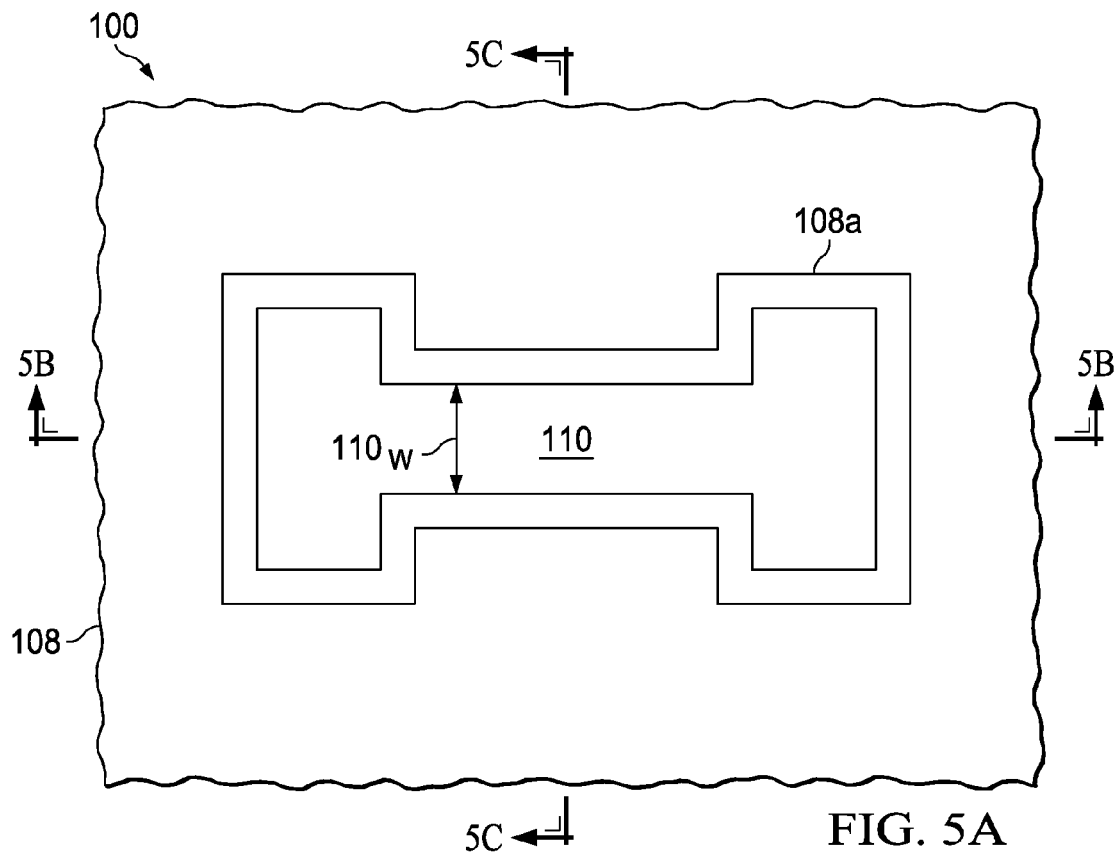
Figure 5B:
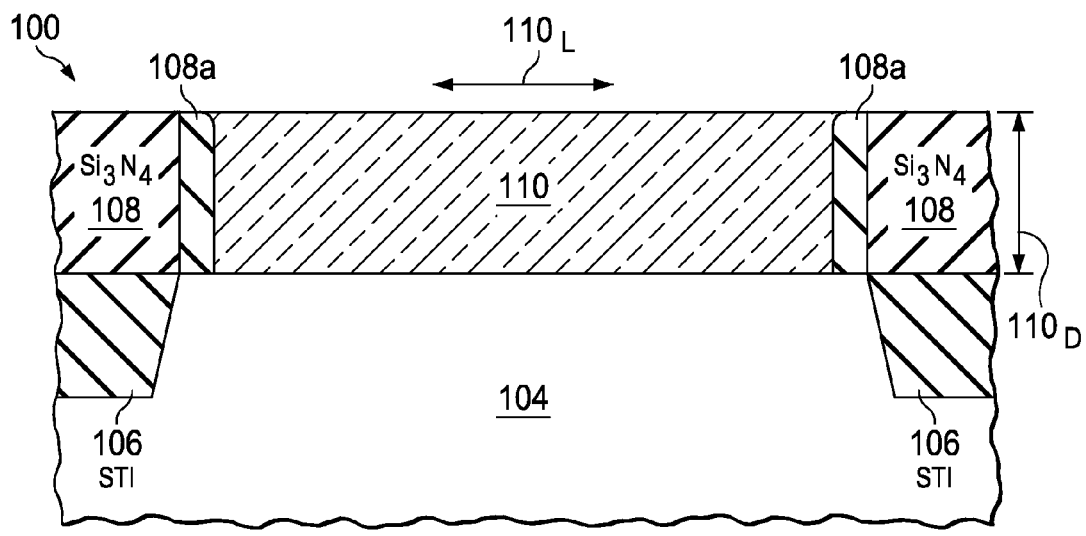
Figure 5C:
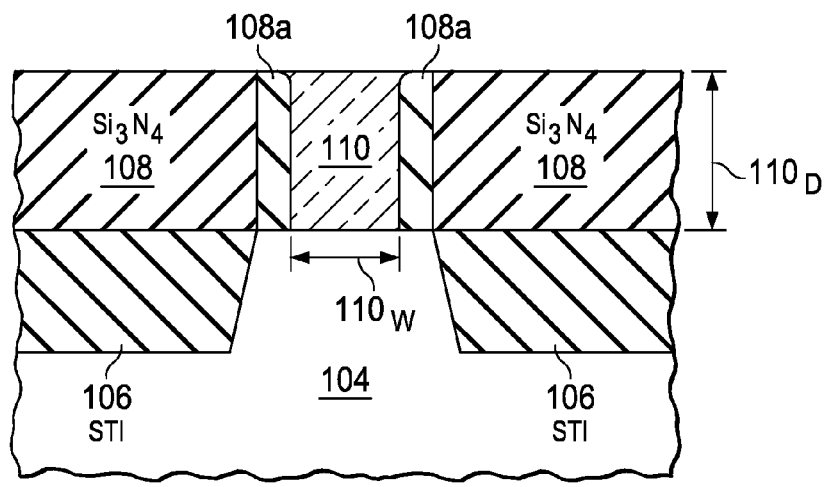

A formed semiconductor body 110 is then created in FIGS. 5A-5C in the opening of the form structure 108, using any suitable semiconductor materials and formation techniques. In the exemplary device 100, an epitaxial semiconductor material 110 is deposited by epitaxial growth processing in the form structure opening, for example, by formation of epitaxial silicon (Si), silicon germanium (SiGe), germanium (Ge), gallium arsenide (GaAs), or other suitable semiconductor material (e.g., epitaxial silicon 110 in the device 100). As discussed above with respect to FIG. 1, other implementations are possible in which the epitaxial semiconductor material is deposited over the starting structure 104 and/or over the patterned form layer material 106. In the case where the epitaxial growth extends above the form structure 108, the device 100 can optionally be planarized, for example, by chemical mechanical polishing (CMP) or other suitable technique, leaving the device 100 as illustrated in FIGS. 5A-5C. By any of these approaches, the formed semiconductor body 110 thus comprises first, second, and third body portions 110a, 110b, and 110c, respectively, extending downward from the planarized top surface to a single generally planar bottom surface above the substrate 104. The body portions are located generally along a horizontal axis in a plane parallel to the plane of the substrate 104 to provide a horizontal transistor body, although other relative orientations are possible.

The first and third body portions 110a and 110c, respectively, will be subsequently doped to provide transistor source/drains, and a gate structure will be formed over portions of the top and sidewalls of the central second body portion 110b to provide a transistor channel therein that extends downward toward the starting structure 104. The channel of the second body portion 110b comprises a prospective channel length $110_L$, a semiconductor body $110_W$, and a channel depth $110_D$, as shown in FIGS. 5A-5C, wherein the channel length $110_L$, and channel depth $110_D$, are generally equal and greater than the semiconductor body $110_W$.

Figure 6A:
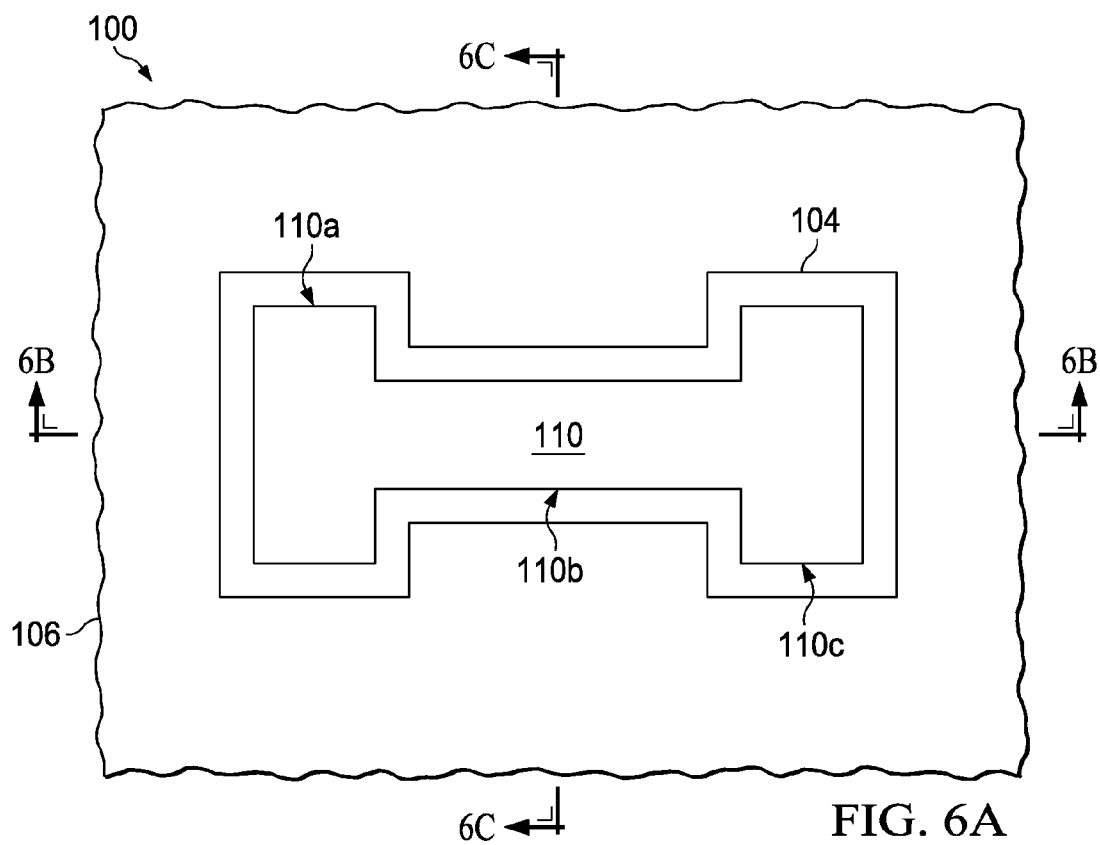
Figure 6B:
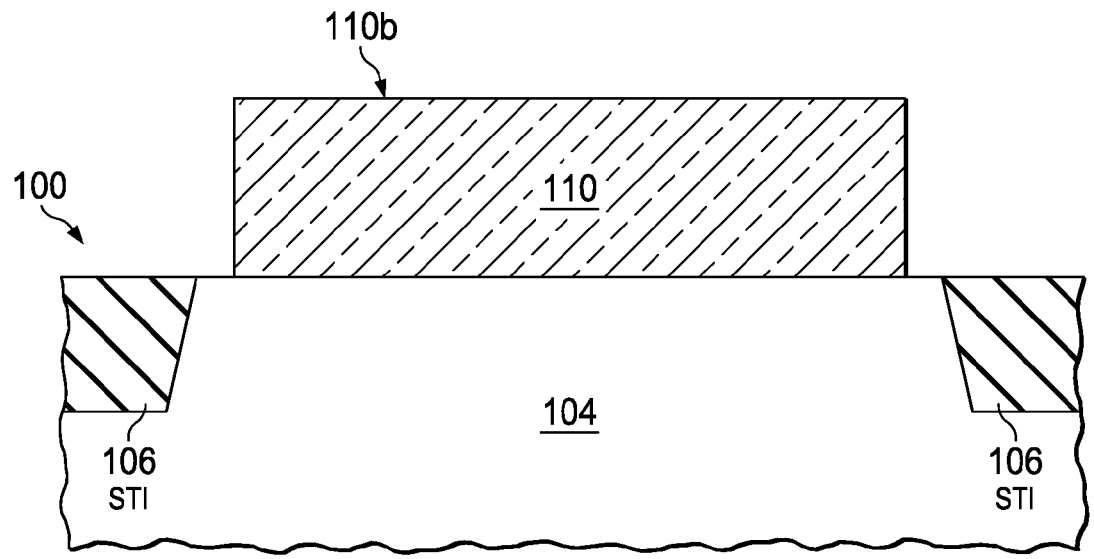
Figure 6C:
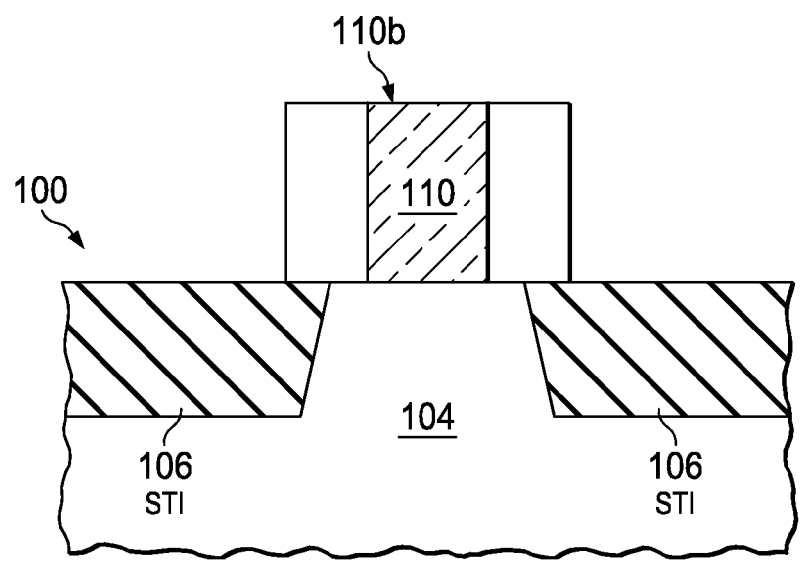
Figure 7A:
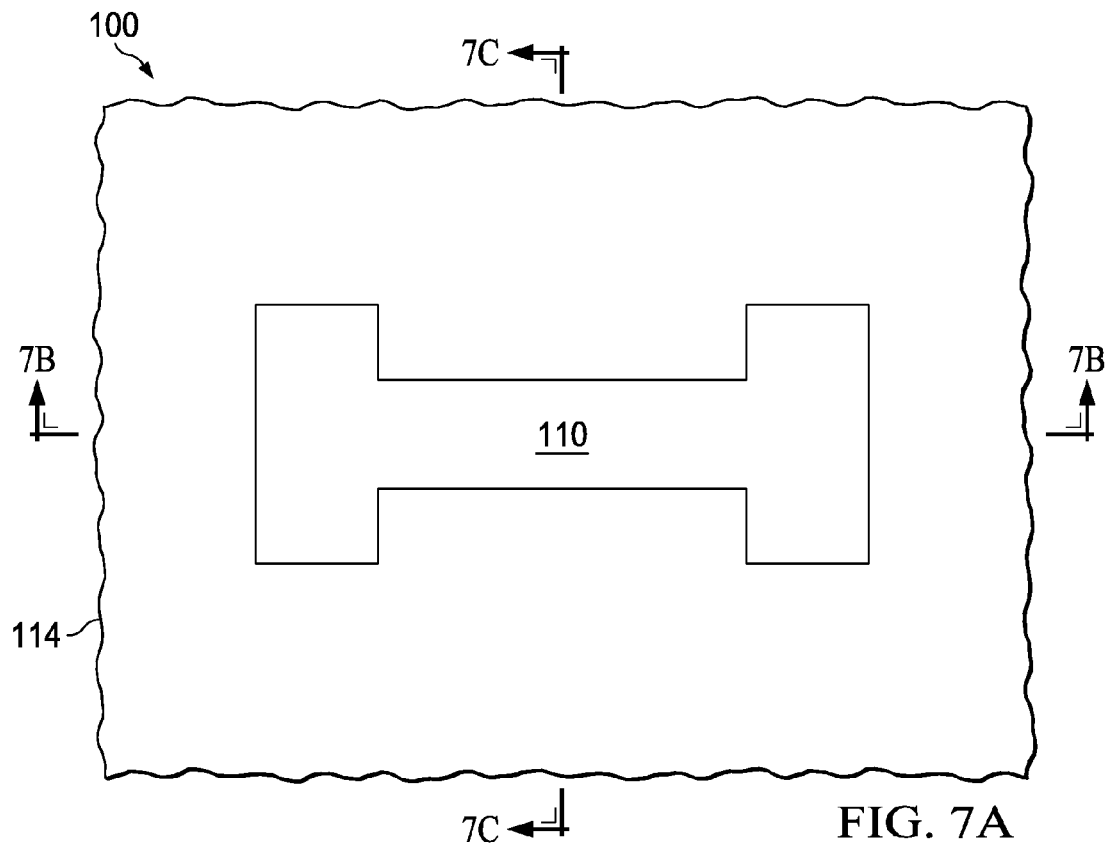
Figure 7B:
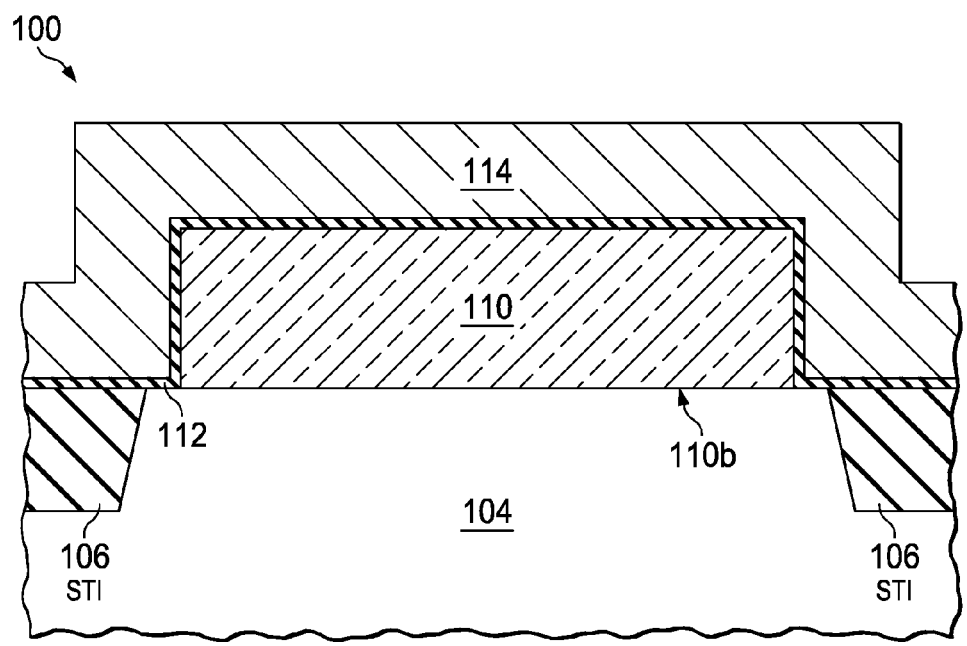
Figure 7C:
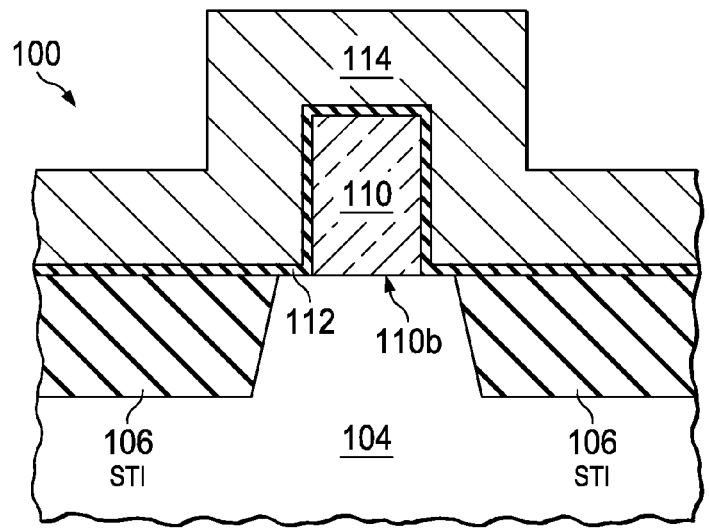
Figure 8A:
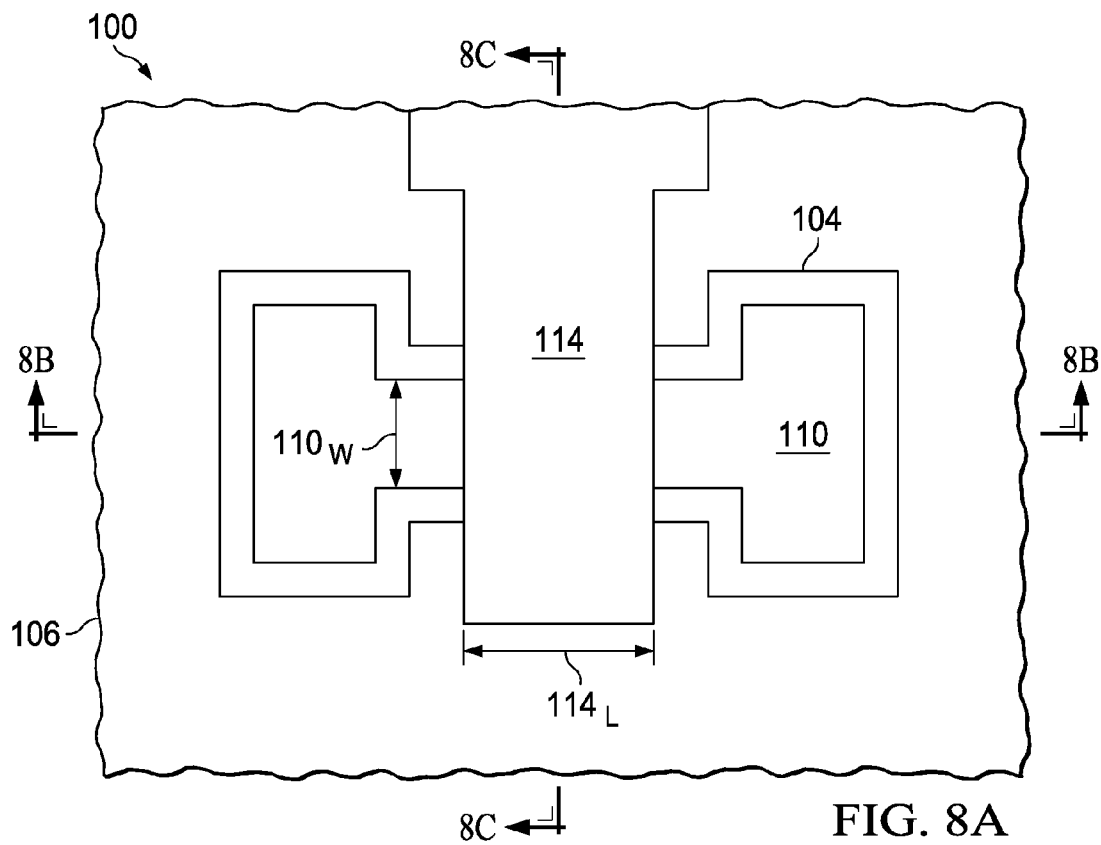
Figure 8B:
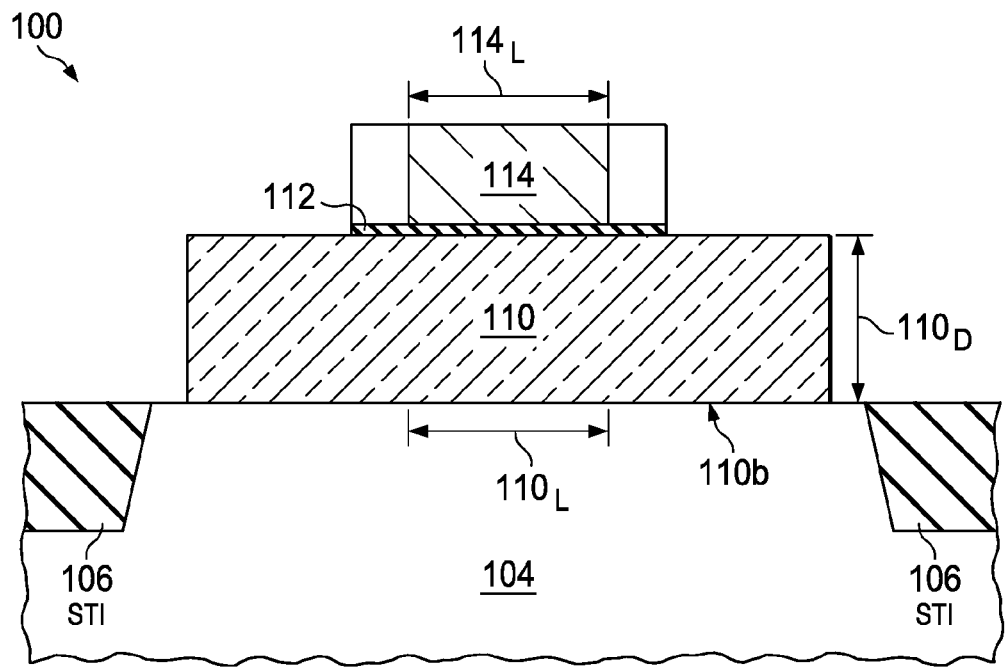
Figure 8C:
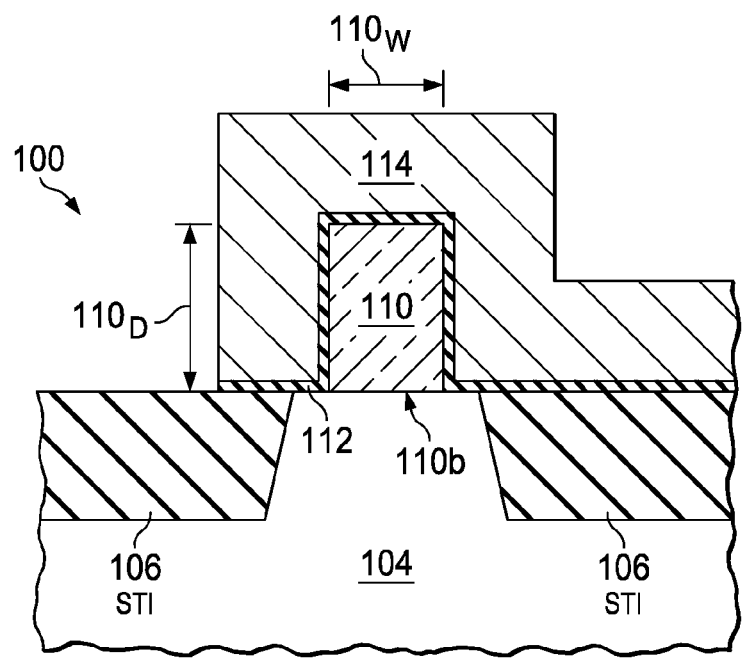

In FIGS. 6A-6C, the form structure 108 is removed, for example, by wet etching or other process, leaving the semiconductor body 110 disposed above the substrate 104. A gate oxide 112 is formed in FIGS. 7A-7C over the semiconductor body 110 and a gate electrode material layer 114 (e.g., polysilicon, metal, or other suitable material) is deposited over the gate dielectric 112. The gate is etched in FIGS. 8A-8C to remove portions of the gate electrode material 114 from the first and third body portions 110a and 110c, respectively. The gate etch also to removes the material 114 over part of the second body portion 110b to leave a patterned gate structure having a gate length $114_L$ corresponding to the channel length $110_L$, wherein the gate etch may, but need not, remove portions of the gate dielectric 112. In the illustrated example, the gate length $114_L$ roughly corresponds to the channel structure depth $110_D$ (e.g., about 25 nm or less in the exemplary device 100), wherein the semiconductor body $110_W$ is less than the gate length $114_L$.

Figure 9A:
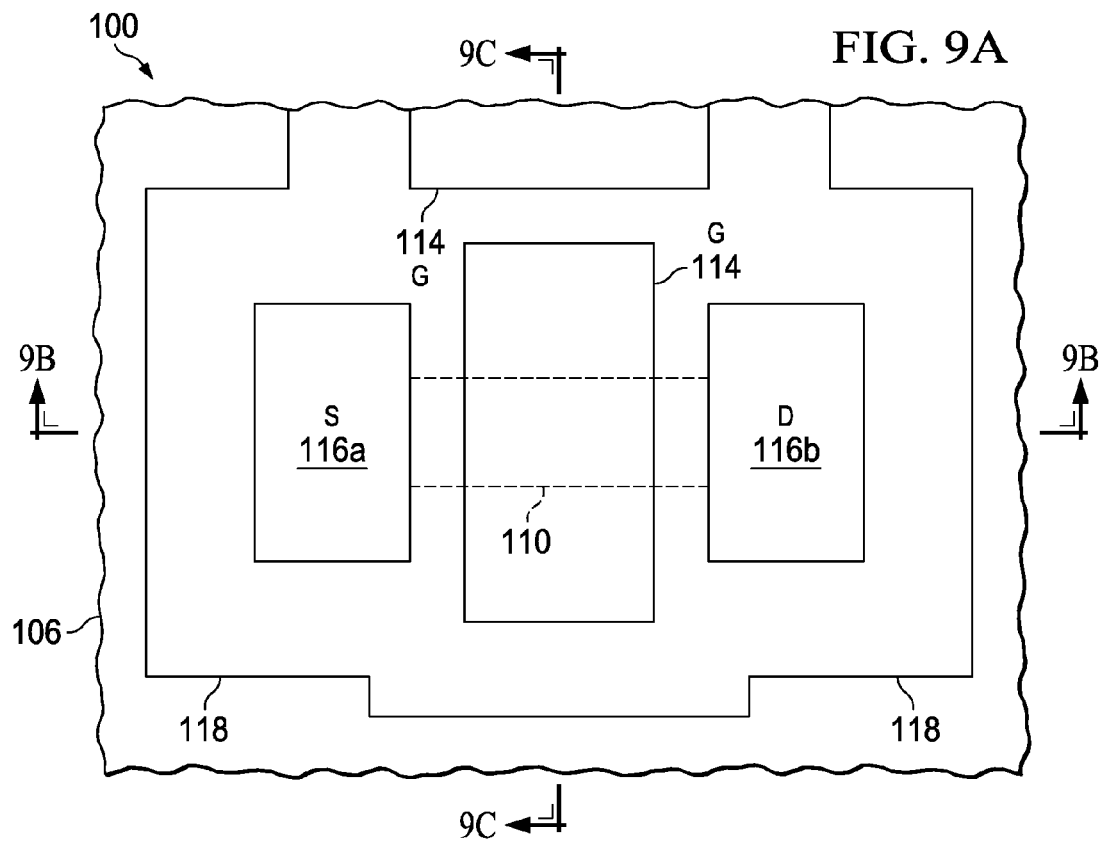
Figure 9B:
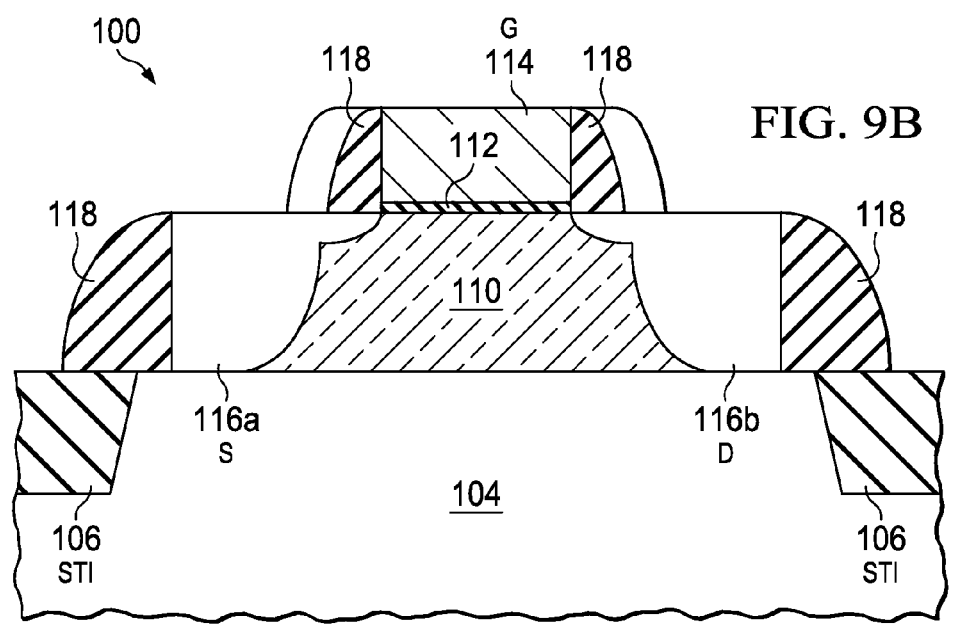
Figure 9C:
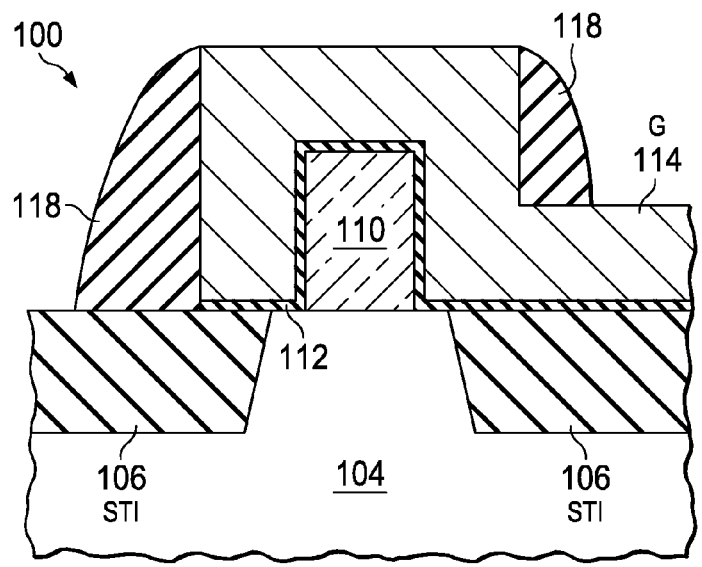

In FIGS. 9A-9C, source/drain regions 116a and 116b are doped with n or p-type dopant species (e.g., depending upon whether an NMOS or PMOS transistor is being constructed) in the first and third body portions 110a and 110b, respectively. The source/drain 116a is indicated as a source "S" and the source/drain 116b is indicated as a drain "D" in the figures, although the source/drains 116 are interchangeable in the illustrated example. The source/drains 116a and 116b are formed by a shallow drain extension dopant implantation to introduce dopants into source/drain regions 116, followed by formation of sidewall spacers 118 along the lateral sidewalls of the patterned gate structure (indicated as "G" in the figures). The source/drains 116a and 116b are further defined by a source/drain implant to provide additional dopants to the source/drain regions 116a and 116b following formation of the sidewall spacers 118. The drain-extension implant and/or the source/drain implant may also provide dopants to the patterned gate electrode material 114 in the case of a polysilicon gate, to increase the conductivity of the gate electrode 114.

Figure 10A:
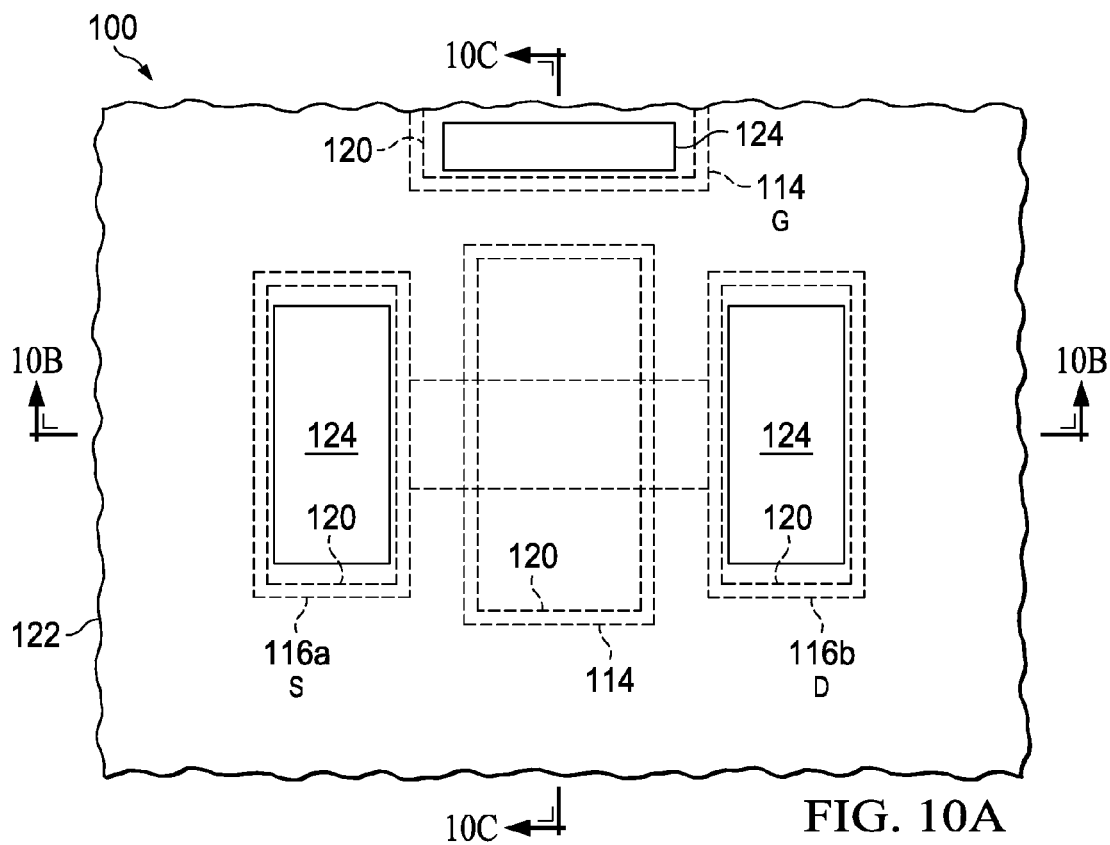
Figure 10B:
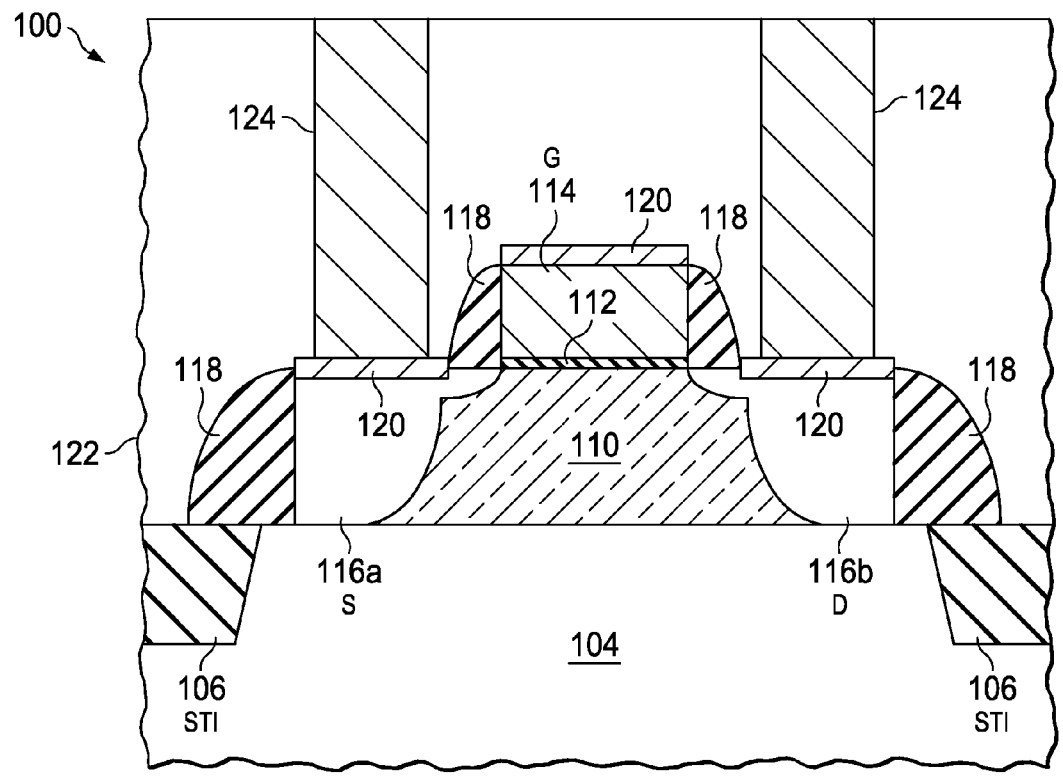
Figure 10C:
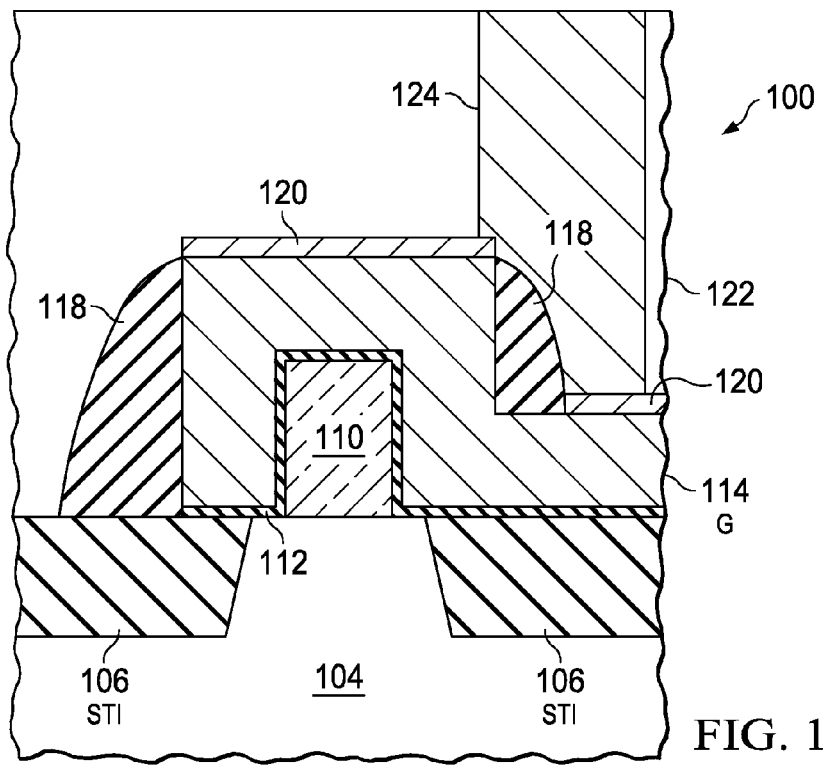
Figure 11A:
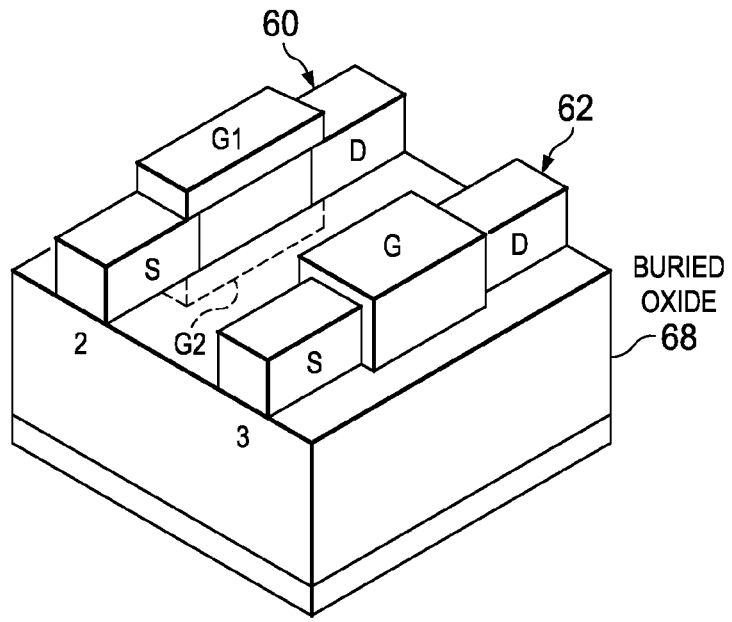
FIGS. 11A and 11B are simplified partial perspective views illustrating several conventional multi-gate transistor designs.
Figure 11B:
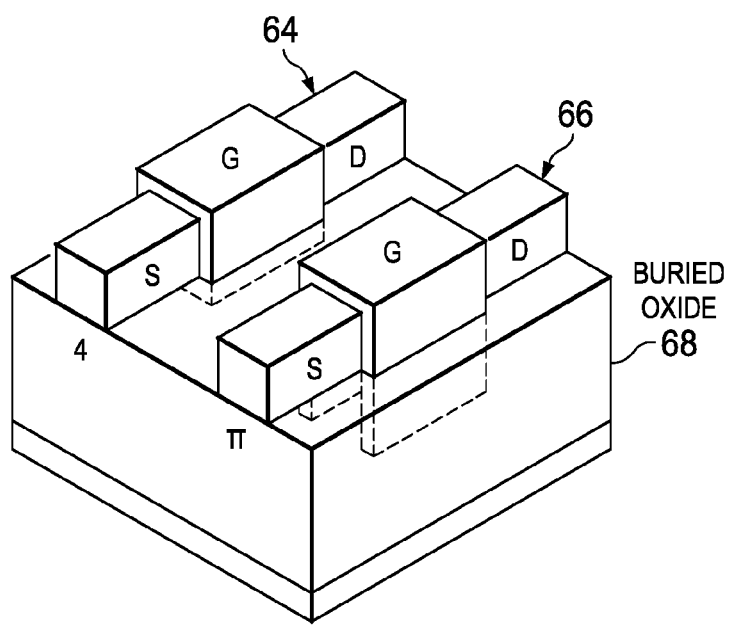

FIGS. 10A-10C illustrate the device 100 after a first metalization level has been constructed, in which silicide 120 is formed over the patterned gate electrode 114 as well as over the source/drains 116a and 116b via any suitable silicidation processing, for example, by depositing nickel over the device 100 and annealing, followed by removal of unreacted nickel. A pre-metal dielectric (PMD) 122 is then deposited and source, drain, and gate contacts 124 are formed through the PMD material 122, after which further metalization (interconnect) processing is performed to complete the device 100 (not shown). The invention thus provides a multi-gate transistor comprising a formed semiconductor body comprising first, second, and third body portions with a generally planar first bottom surface overlying a starting structure, in which the second body portion comprises a lithography independent lateral width (e.g., semiconductor body $110_W$).

Figure 4A:
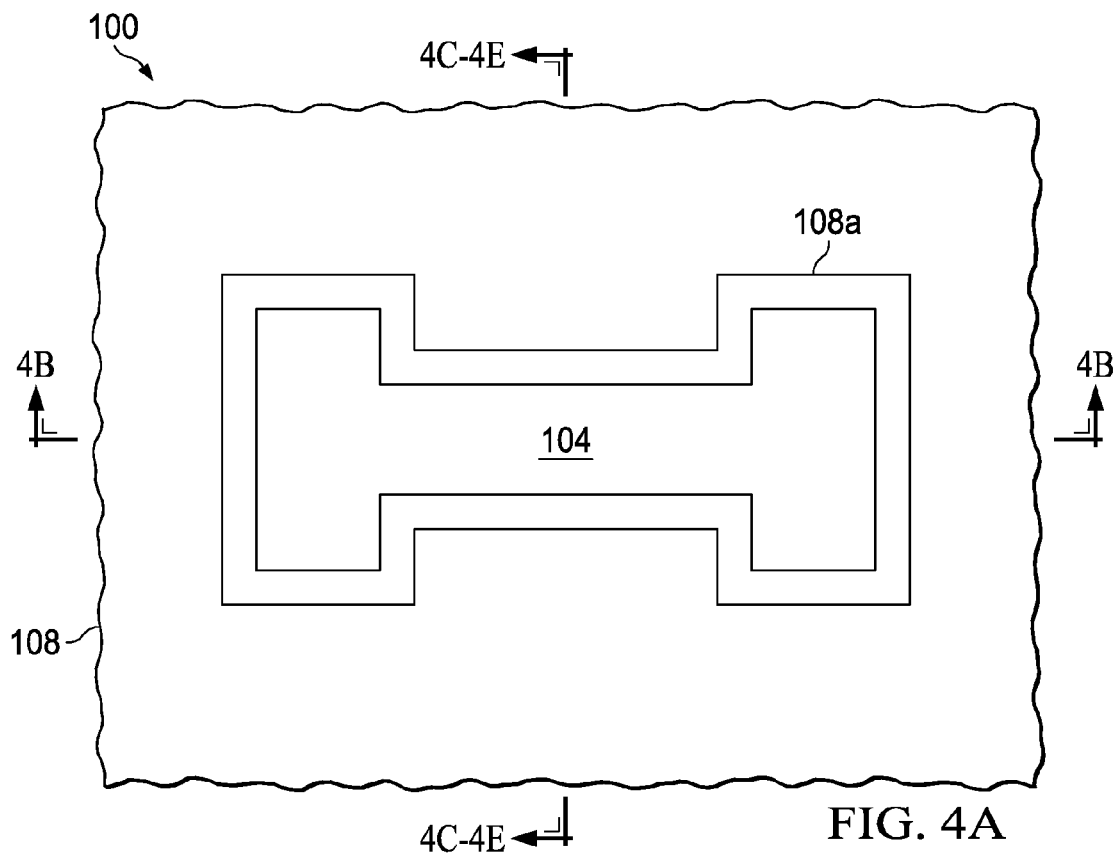
Figure 4B:
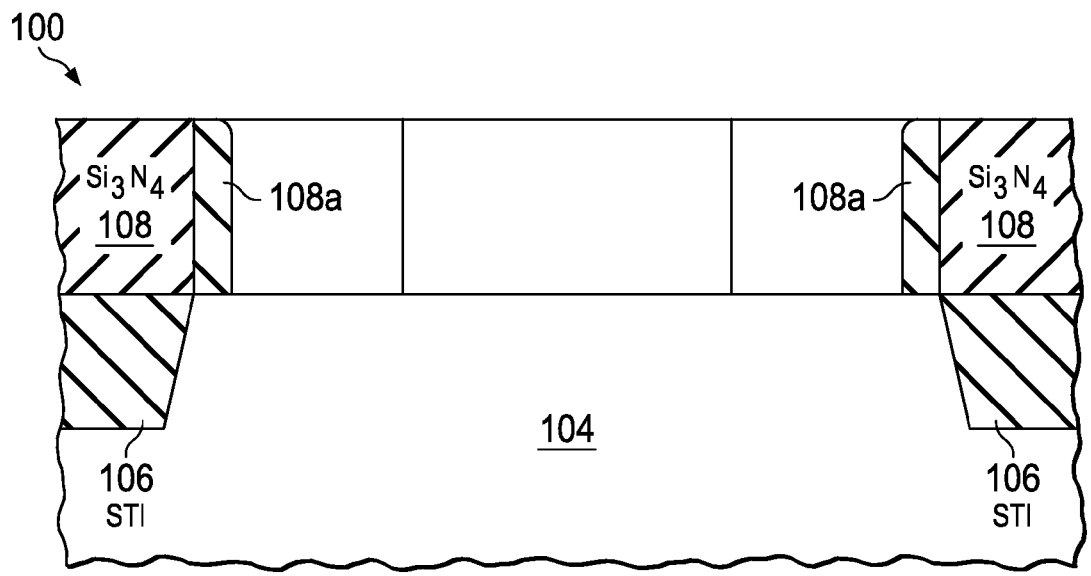
Figure 4C:
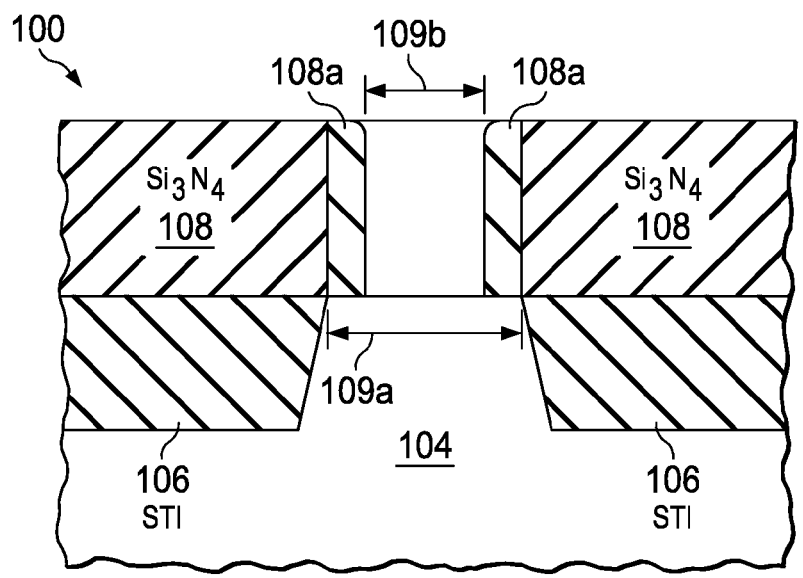
Figure 4D:
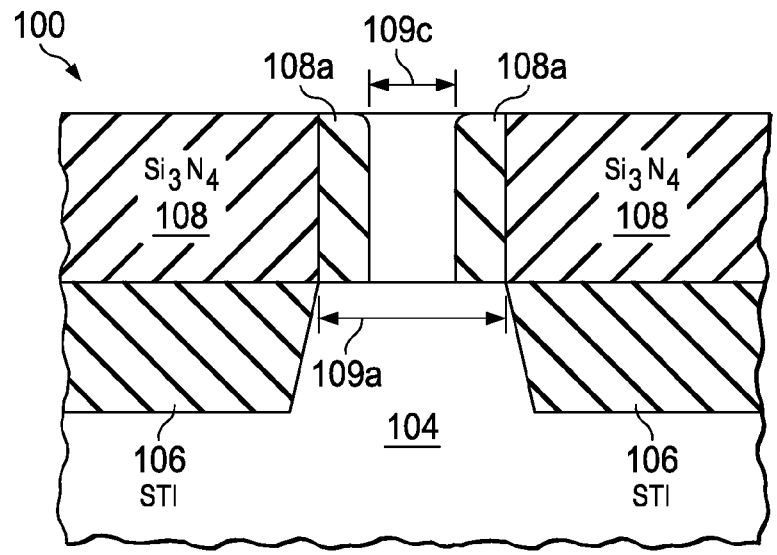
Figure 4E:
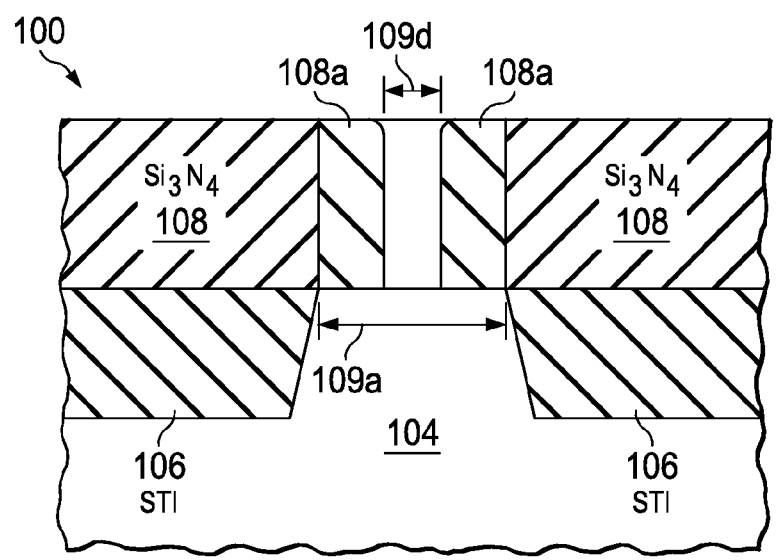

This aspect of the invention may thus be employed to facilitate optimization of volume inversion and/or other performance parameters, even where the transistor is scaled to the minimum gate length achievable for a particular lithography technology. In this regard, the semiconductor body $110_W$ may be made less than half the gate length $114_L$, for example, about one third of the gate length $114_L$, by providing wider spacers 108a, as shown in FIGS. 4D and 4E above. Other implementations are possible, for example, dual-gate devices having gate portions extending along two sides (e.g., or one side and the top) of the central second body portion 110b.

Figure 12:
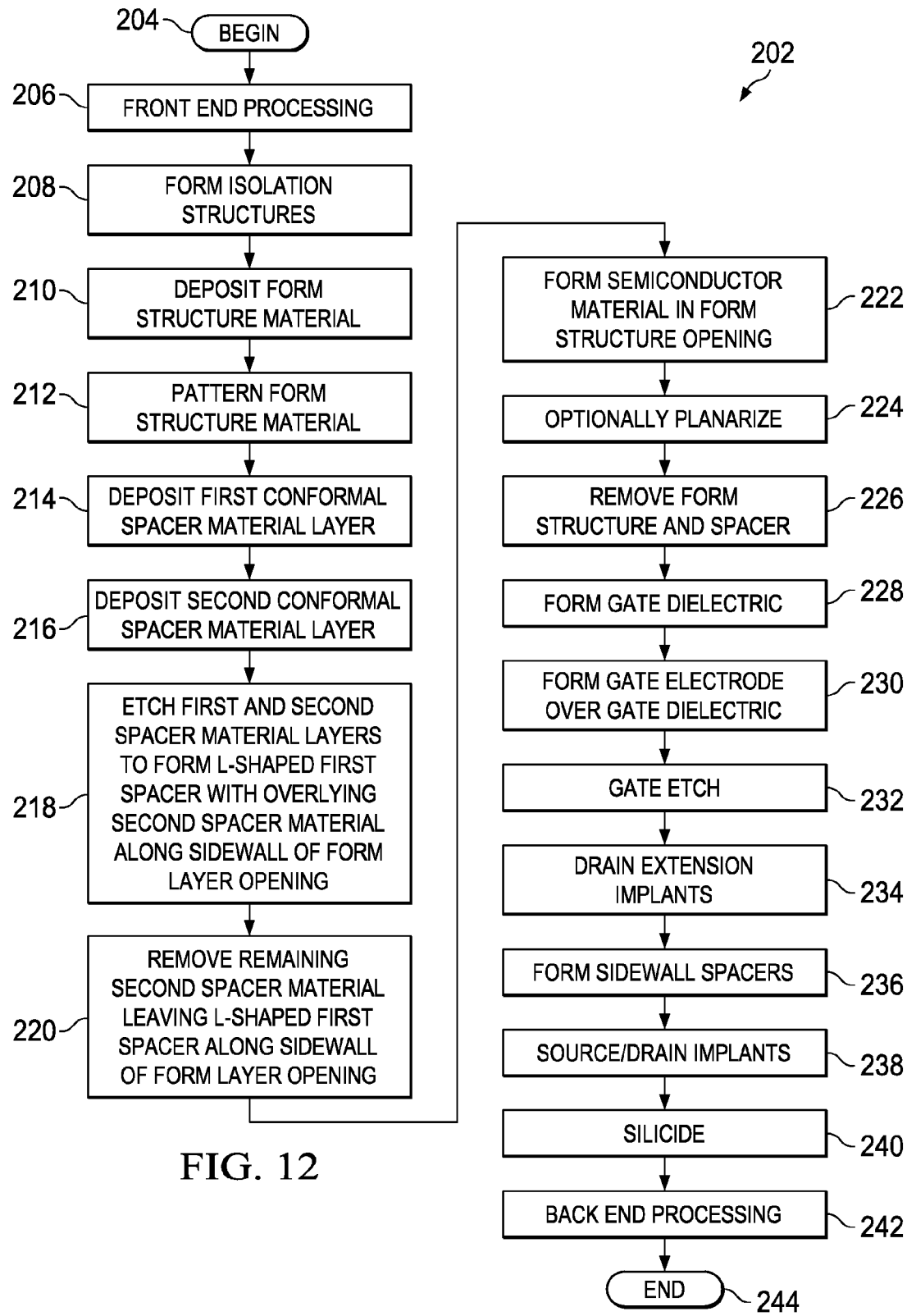
FIG. 12 is a flow diagram illustrating another exemplary method for fabricating a multiple-gate MOS transistor in accordance with the present invention.

Referring now to FIGS. 12-21C, another aspect of the invention facilitates creation of MOS transistors having more that 3 gates by fabricating a formed semiconductor body having an undercut or recess, in which a portion of the gate structure is formed. In this manner, the gate extends along two or more of the sides and top of the channel, as well as under a portion of the channel, as illustrated and described hereinafter. FIG. 12 illustrates a method 202 for fabricating transistors in accordance with this aspect the invention. Beginning at 204, the method 202 comprises front end processing at 206, for example, including formation of wells and other initial processing of a starting structure, and isolation structures are formed at 208 in field regions of the starting structure. A form structure is deposited and patterned at 210 and 212 for use in forming a semiconductor body, for example, using the techniques and materials described with respect to FIG. 2 above.

An L-shaped spacer is then constructed along the sidewalls of the form structure opening, so that the subsequently deposited semiconductor body includes an undercut or recess (e.g., creating a second bottom surface spaced from the starting structure). Such a spacer can be formed using any suitable techniques, wherein the illustrated example provides for deposition and etching of two spacer material layers at 214-220. It is noted that the illustrated technique advantageously avoids masked etching, and is thus lithography independent, wherein the semiconductor body and other dimensions of the semiconductor body can be made smaller than the minimum patternable feature size (e.g., smaller than a scaled gate length).

First and second spacer material layers are deposited at 214 and 216, respectively, preferably using CVD, ALD, or other conformal deposition techniques, and any suitable materials, such as silicon nitride and/or silicon dioxide. In the illustrated implementation, silicon nitride is deposited at 214 over the form structure and over the exposed starting structure, and silicon dioxide is deposited at 216 over the first spacer material layer to any suitable thicknesses via CVD processes. At 218, the first and second spacer material layers are etched, for example, by RIE or other generally anisotropic etch processing, to create a generally L-shaped portion of the first spacer material layer extending over part of the starting structure along the sidewall of the form structure opening. The same etch process may be continued or a second etch process may be employed at 220 to remove remaining second spacer material, leaving the L-shaped spacer along the bottom corners of the form structure opening. The dimensions of the L-shaped spacer impact the vertical and lateral dimensions of the undercut in the subsequently formed semiconductor body, and hence determine the extent to which the gate structure underlies the channel, and the thickness thereof. Accordingly, the dimensions of the L-shaped spacer may be controlled, for example, by adjusting the deposition thickness of the form layer, of the first spacer material layer, and/or of the second spacer material layer, as well as through adjustment of the spacer etch duration.

Semiconductor material is then formed at 222 in the opening of the patterned form structure by epitaxial growth or other deposition of silicon or other semiconductor (e.g., Si, SiGe, Ge, GaAs, etc.), and if needed, the wafer can optionally be planarized at 224 (e.g., using CMP). The form structure material and the spacer are then removed at 226, for example, by wet etching. The remaining formed semiconductor body comprises first and second bottom surfaces, the first overlying the starting structure and the second in a recess or undercut region, which is spaced from the starting structure by virtue of the L-shaped spacer present during semiconductor body deposition at 222.

In the exemplary device 300 illustrated and described below, the undercut feature of the lower portion of the semiconductor body extends along the entire periphery of the semiconductor body. However, other implementations are possible within the scope of the invention, wherein the undercut only extends along a portion of the semiconductor body. For example, the undercut may extend along the channel portion of the semiconductor body, such that a gate structure can be formed in the undercut so as to be disposed beneath a portion of the channel. Moreover, the undercut technique illustrated in the method 2 and the device 300 may be employed alone or in combination with the above techniques for providing lithography independent semiconductor body dimensions (e.g., semiconductor body, etc.), wherein all such implementations are contemplated as falling within the scope of the invention and the appended claims.

A gate structure is formed at 228-232 along a portion of a top and sides of the formed semiconductor body, and in the undercut between the underlying starting structure and the second bottom surface of the semiconductor body. A gate dielectric is formed at 228, for example, by a thermal oxidation process, a deposition process, or other material formation technique, which covers the exposed portions of the formed semiconductor body, including the top, sides, and second bottom surface thereof. A gate electrode material layer (e.g., polysilicon, metal, etc.) is deposited at 230 over the gate dielectric, which fills all or a portion of the undercut in the lower semiconductor body.

A gate etch is performed at 232 using any suitable patterning techniques to selectively remove portions of the gate electrode material, which may also remove portions of the gate dielectric material. The gate etch at 232 defines a patterned transistor gate structure with multiple gate segments that extend along portions of the top and sides of the semiconductor body, as well as along a portion of the second bottom surface in the undercut area. The portion of the semiconductor body structure covered by the patterned gate structure operates as a transistor channel (e.g., all or part of the second body portion 310b in the device 300 below), and portions of the remaining semiconductor body (e.g., body portions 310a and 310c below) will be doped to operate as source/drains.

At 234, a shallow drain extension dopant implantation is performed to provide dopants in source/drain portions of the formed semiconductor body (e.g., in the first and third body portions), as well as in the gate electrode, after which the patterned gate and the semiconductor body may be encapsulated. Sidewall spacers are formed at 236 along the sidewalls of the encapsulated gate structure and the sides of the formed semiconductor body, which may also extend into portions of the undercut region. A source/drain implant is performed at 238 to further dope the source/drain portions, which may be an angled implant, and metal silicide gate and source/drain contacts are formed at 240. Back end processing, including metalization is then performed at 242 to complete the device fabrication processing and the method 202 ends at 244.

FIGS. 13A-21C illustrate an exemplary triple-gate MOS transistor is illustrated in a semiconductor device 300, undergoing processing at various stages of fabrication, generally according to the method 202 above. FIGS. 14A, 15A, 16A, 17A, 18A, 19A, 20A and 21A illustrate sectional top plan views of the device 300 and the other figures are side and end views as shown by the sections lines in the corresponding plan views. Referring initially to FIGS. 13A-14C, the device 300 comprises a silicon substrate 304 starting structure and $SiO_2$ STI isolation structures 306 formed in field regions of the substrate 304 around the periphery of an "H"-shaped portion of the starting structure 304. The central portion of the H-shape has a width 307 (FIG. 14A) generally corresponding to a desired gate length for the triple-gated transistor to be formed thereover in the illustrated example.

Figure 13A:
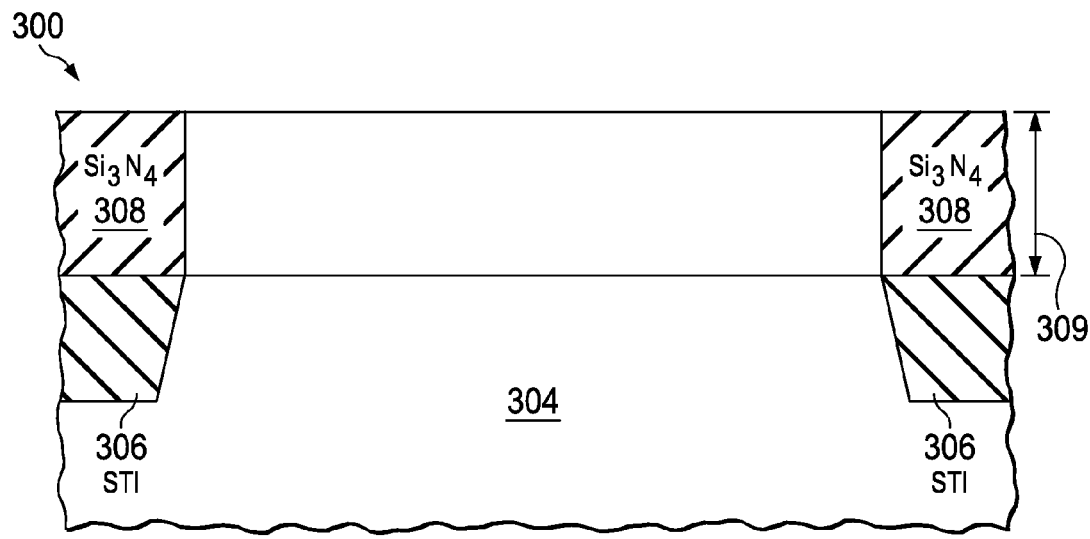
FIGS. 13A-21C are partial top plan and side elevation views in section illustrating a portion of a semiconductor device with another exemplary multiple-gate MOSFET device in accordance with the invention, shown at various stages of fabrication processing.

As shown in FIG. 13A, a form structure 308 is created above the substrate 304, which is generally aligned with the underlying STI structures 306. The form structure 308 may be created using any suitable materials by any fabrication techniques within the scope of the invention. In the illustrated example, silicon nitride (e.g., $Si_3N_4$) material 308 is deposited to a thickness 309 generally the same as the desired final transistor gate length by CVD, ALD, or other deposition process. The deposited form layer material 308 is then selectively patterned, leaving an opening through which a single contiguous portion of the starting structure 304 is exposed. In this example, the form structure is formed with an "H"-shaped cavity or opening exposing the "H"-shaped portion of the substrate 304, where the central portion of the opening has a width 309a (FIG. 14C) generally equal to the thickness 309 and to the desired final transistor gate length, although the invention is not limited to the illustrated "H" shape.

Figure 13B:
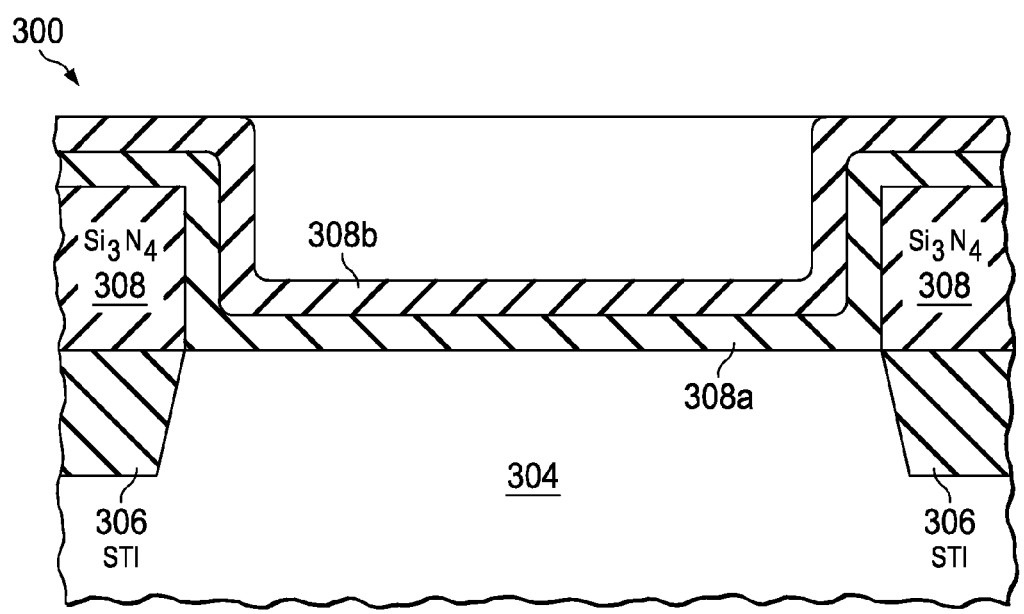
Figure 13C:
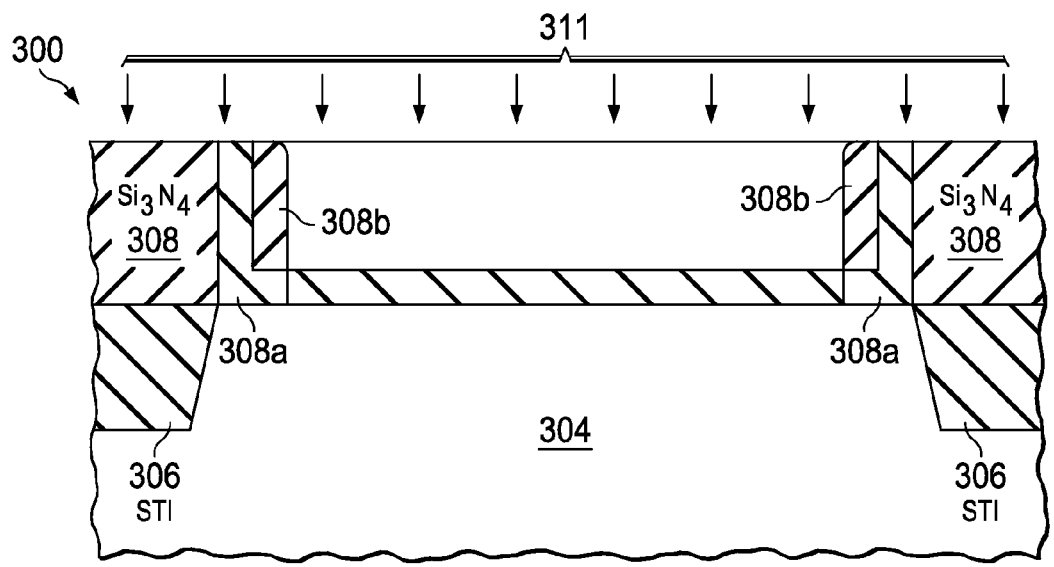
Figure 14A:
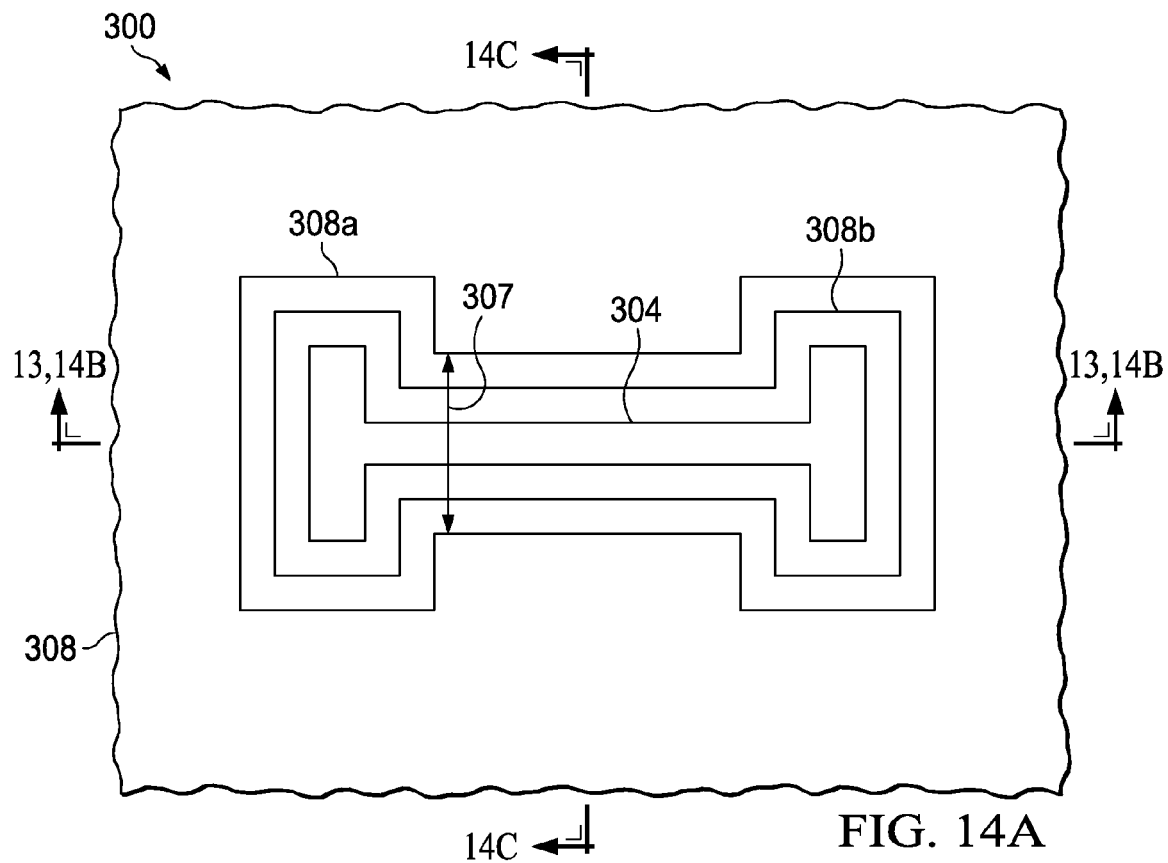
Figure 14B:
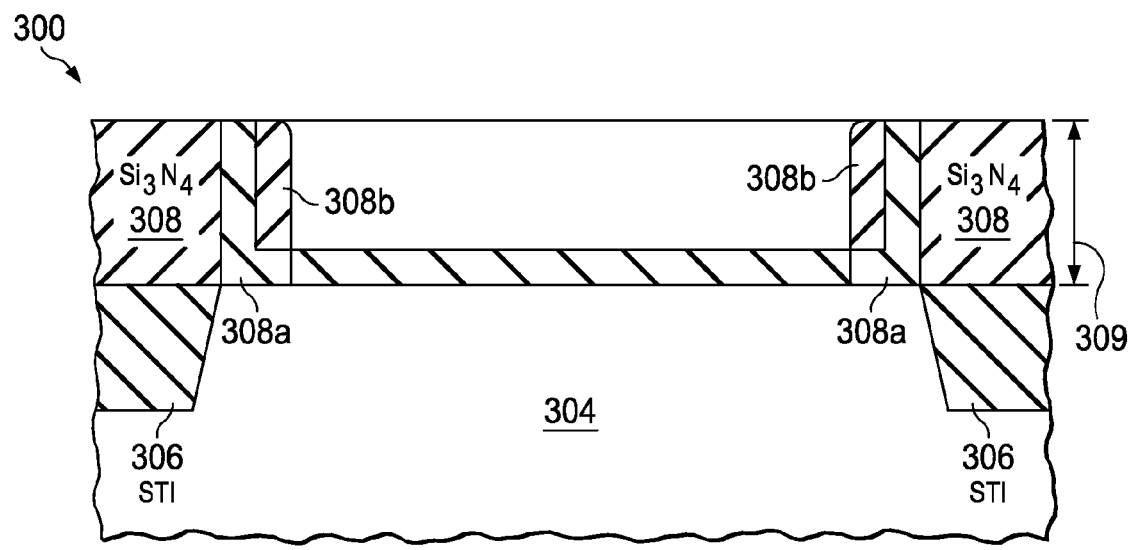
Figure 14C:
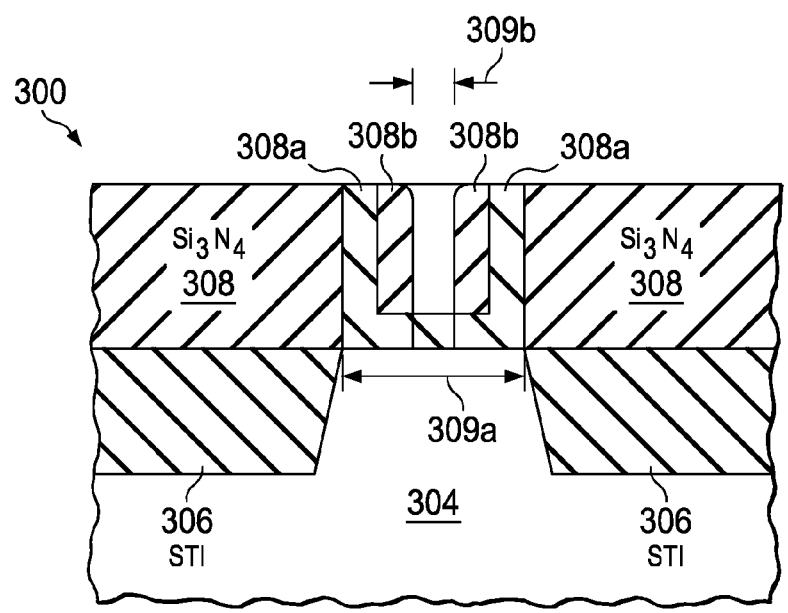

In FIG. 13B, first and second spacer material layers 308a and 308b, respectively, are deposited, using CVD, ALD, or other suitable process. The spacer layers 308a and 308b may be any suitable material and thickness, such as $Si_3N_4$ and $SiO_2$, respectively, each being formed to a thickness about one sixth of the desired gate length in the illustrated example. The spacer material layers 308a and 308b are then etched in FIG. 13C via an RIE etch process 311. This initially leaves a generally L-shaped portion of the first spacer material layer 308a extending over part of the starting structure along the sidewall of the form structure opening, with a remaining portion of the second layer 308b thereover, as shown in FIGS. 14A-14C. At this point, the opening in the central portion of the form/spacer structure has a width 309b (FIG. 14C) approximately one third of the width 309a.

Figure 15A:
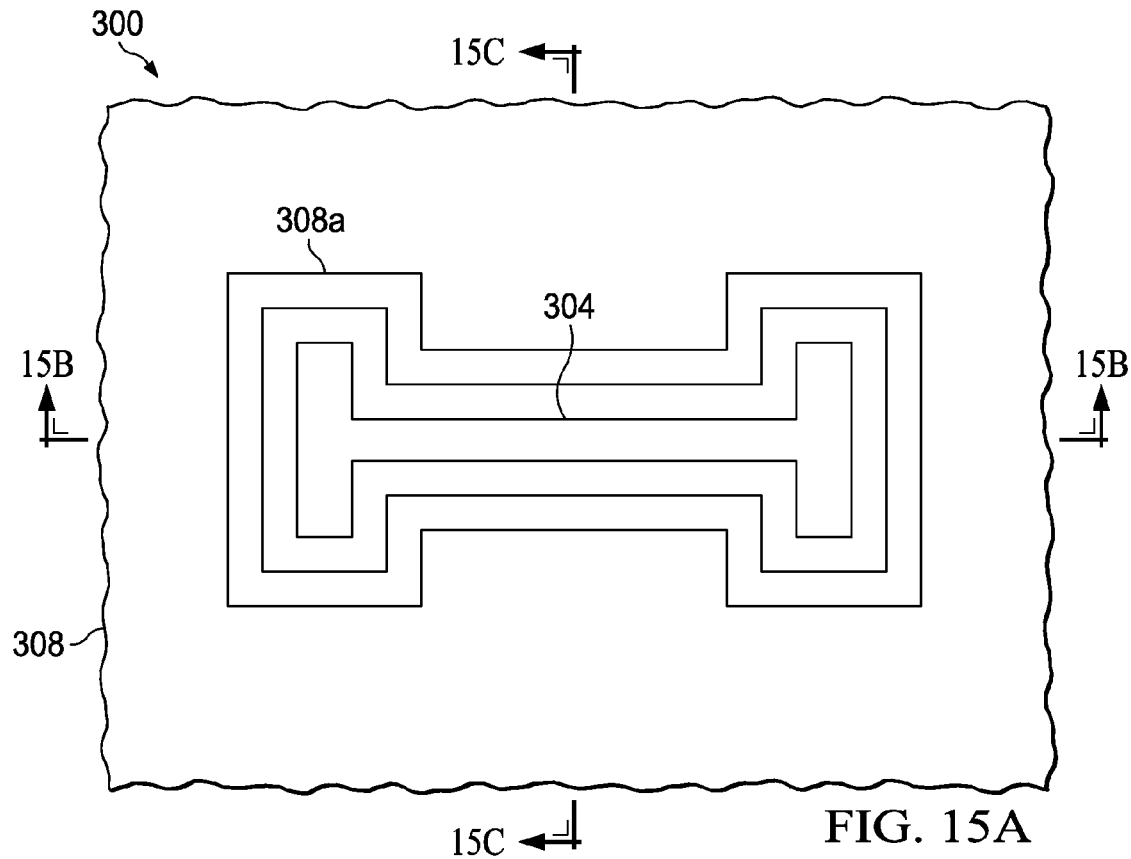
Figure 15B:
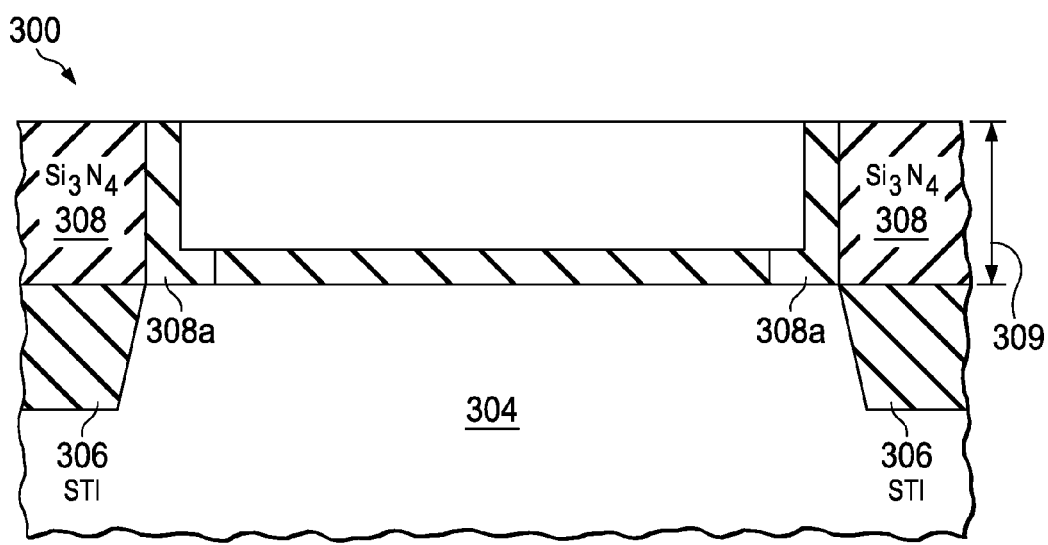
Figure 15C:
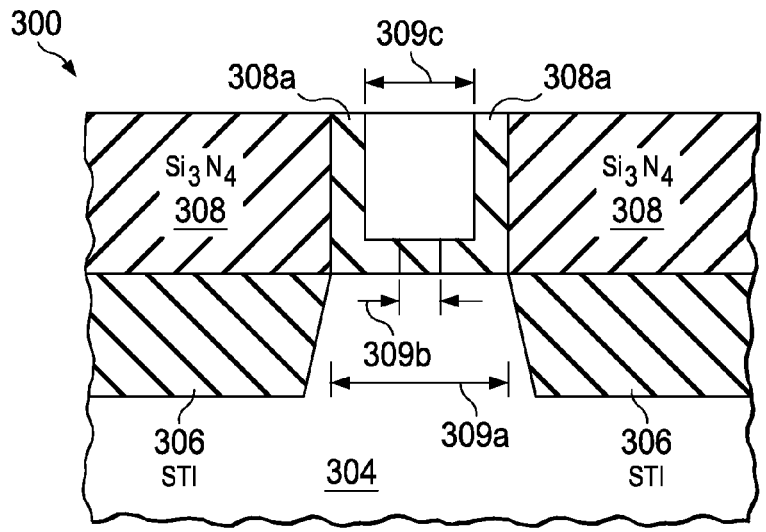

The etch process 311 is continued to remove remaining second spacer material 308b as shown in FIGS. 15A-15C, leaving the L-shaped spacer 308a along the bottom corners of the form structure opening. As shown in FIG. 15C, the central portion of the form/spacer structure has an upper width 309c about two thirds of the width 309a, and a lower width 309b about one third of the width 309a. The dimensions of the remaining spacer 308a may be different than those of the illustrated device 300 within the scope of the invention, for example, where the dimensions may be adjusted through changes in the form structure thickness 309, the deposition thicknesses of the spacer material layers 308a and 308b, and the duration of the etch process 311. Any form structure thickness 309 may be used and the spacer 308a may be constructed using other materials and formation techniques within the scope of the invention. In the device 300, the lateral upper width 309c determines the semiconductor body of the quad-gate transistor (e.g., width $310_W$ in FIG. 17C below).

Figure 16A:
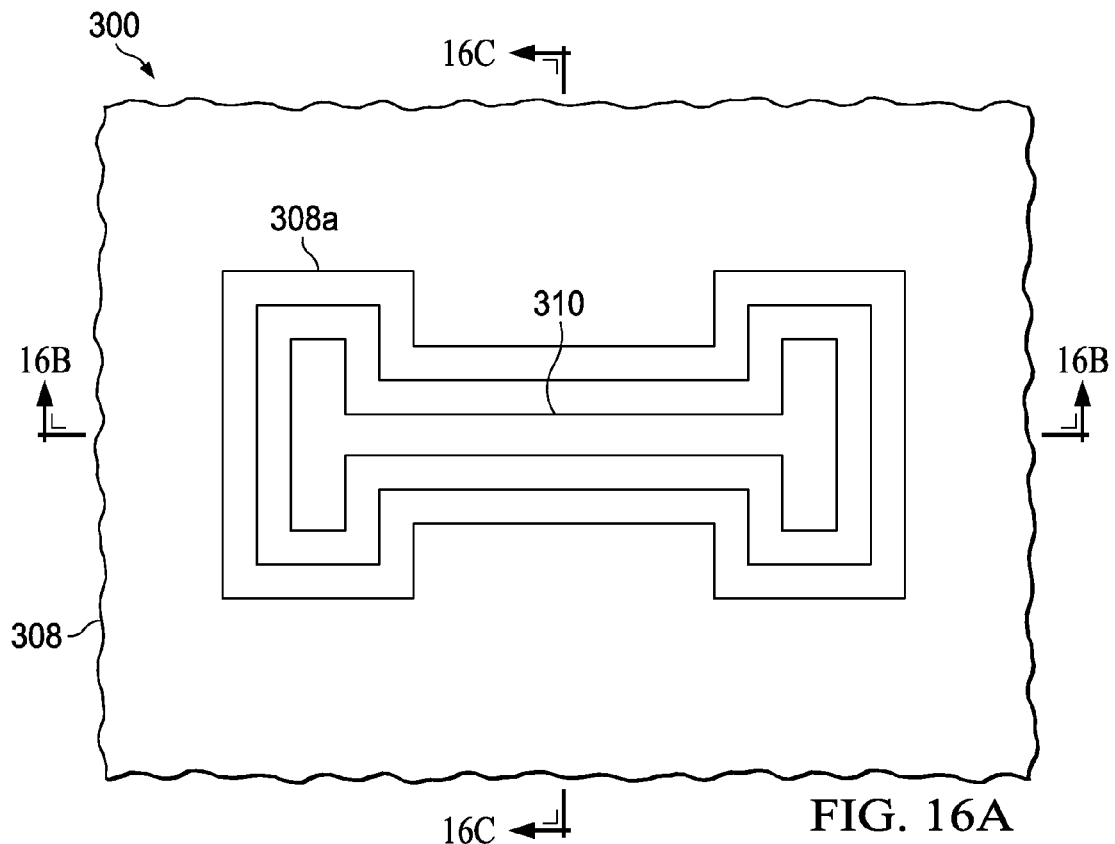
Figure 16B:
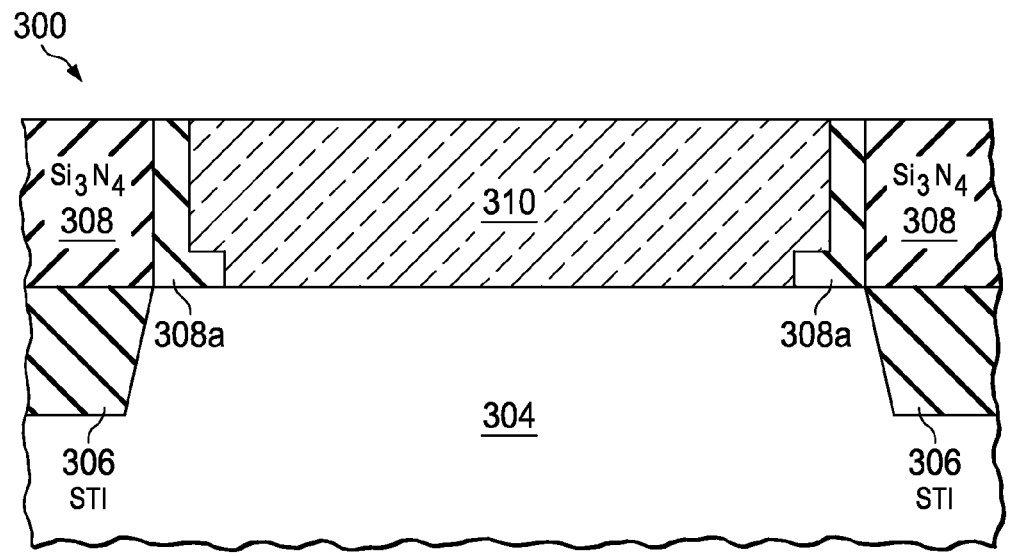
Figure 16C:
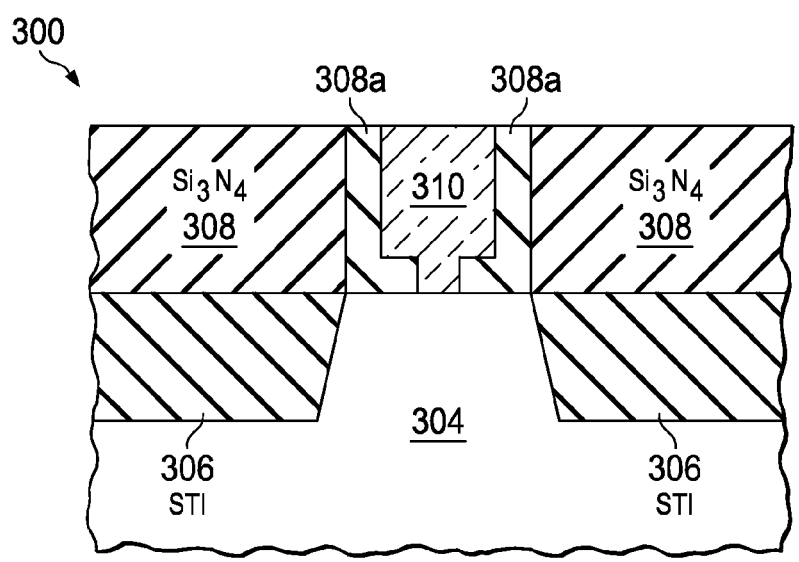
Figure 17A:
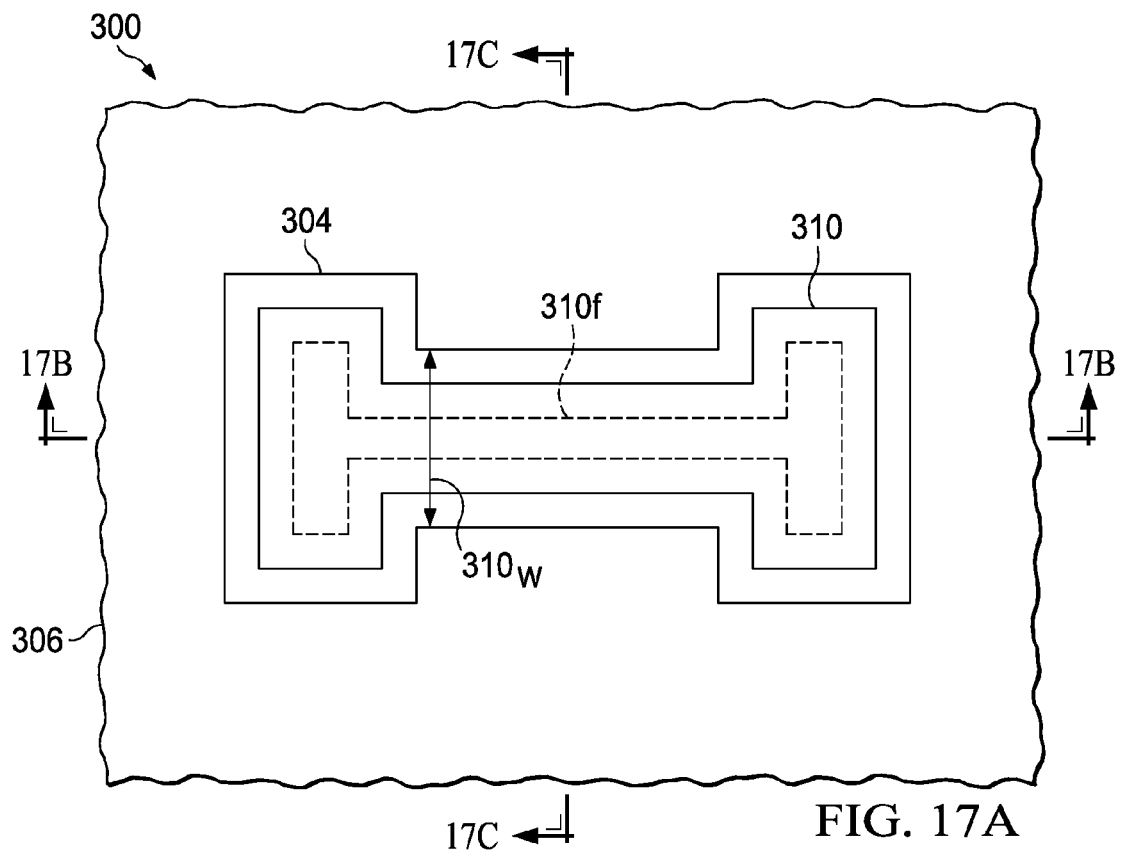
Figure 17B:
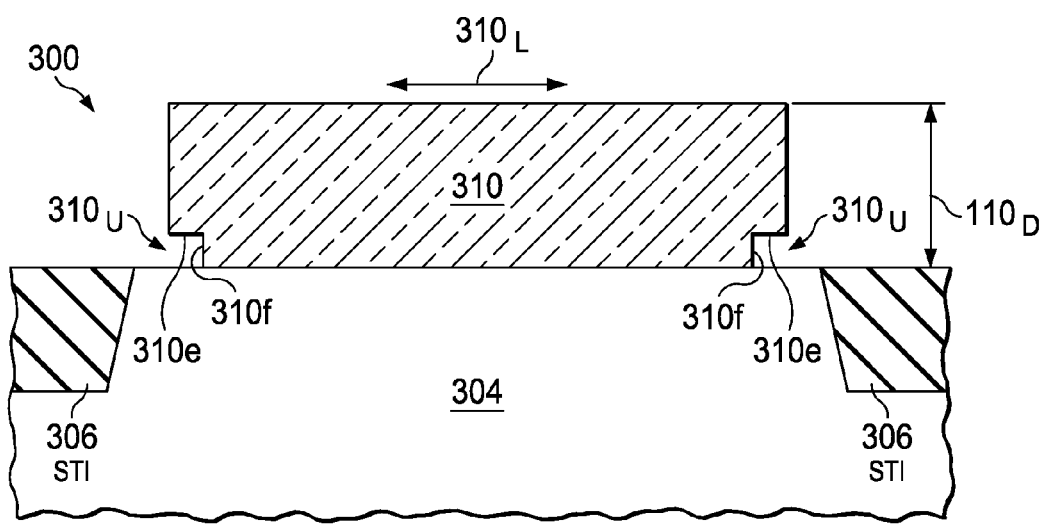
Figure 17C:
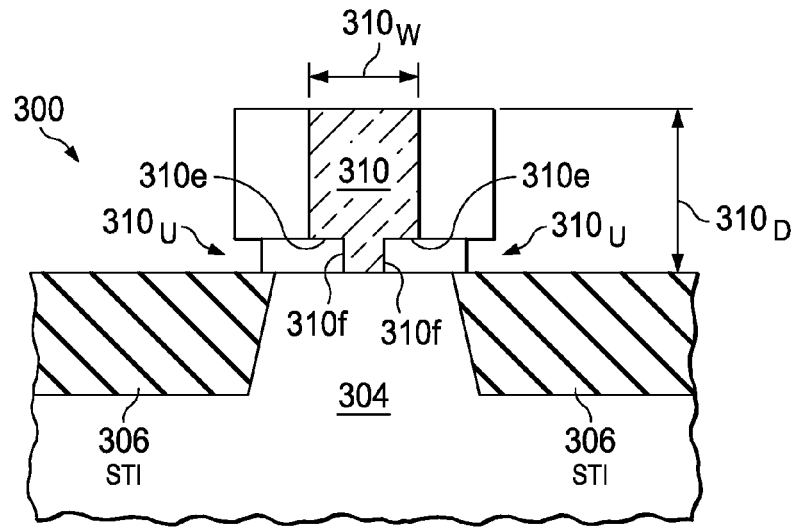

A formed semiconductor body 310 is then created in FIGS. 16A-16C in the opening of the form/spacer, by epitaxial growth or other deposition of silicon or other suitable semiconductor materials (e.g., Si, SiGe, Ge, GaAs, etc.), after which the wafer can optionally be planarized (e.g., using CMP). In FIGS. 17A-17C, the form structure 308 and spacer 308a are removed, for example, by wet etching or other process, leaving the semiconductor body 310 disposed above the substrate 304. The formed semiconductor body 310 comprises first, second, and third body portions 310a, 310b, and 310c, respectively, extending downward from the planarized top surface to a first generally planar bottom surface overlying the substrate 304. The body portions are located generally along a horizontal axis in a plane parallel to the plane of the substrate 304 to provide a horizontal transistor body, although other relative orientations are possible.

The semiconductor body 310, moreover, includes a recess or undercut region or area $310_U$ along the lower periphery of the semiconductor body 310, comprising a generally horizontal second bottom surface 310e spaced from the starting structure 304, and a generally vertical inner or recessed side surface 310f, as shown in FIGS. 17A-17C. The first and third body portions 310a and 310c, respectively, will be subsequently doped to provide transistor source/drains. A patterned gate structure will be formed over portions of the top and sidewalls of the central second body portion 310b, as well as in the undercut region 310u thereof, to create a transistor channel that extends downward toward the starting structure 304. As illustrated in FIGS. 17A-17C, the channel of the second body portions 310b comprises a prospective channel length $310_L$, a semiconductor body $310_W$, and a channel depth $310_D$, as shown in FIGS. 16A-16C, wherein the channel length $310_L$, and channel depth $310_D$, are generally equal and greater than the semiconductor body $310_W$.

Figure 18A:
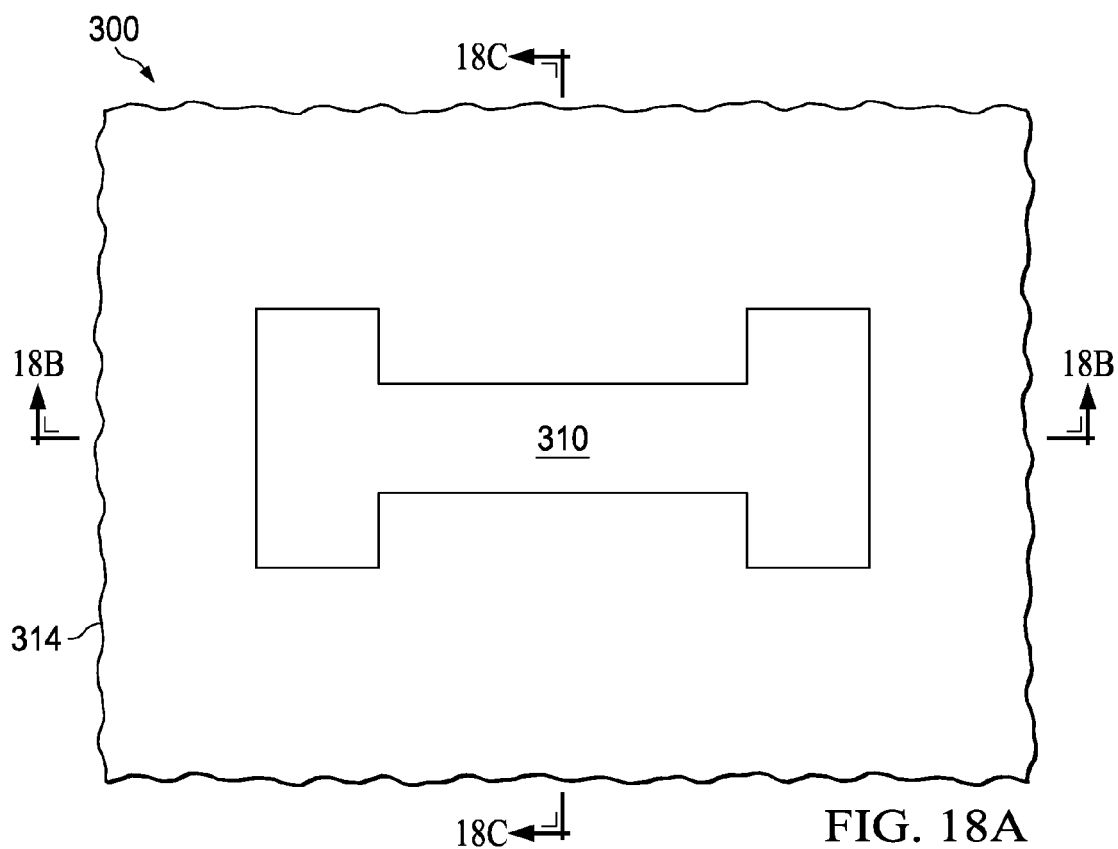
Figure 18B:
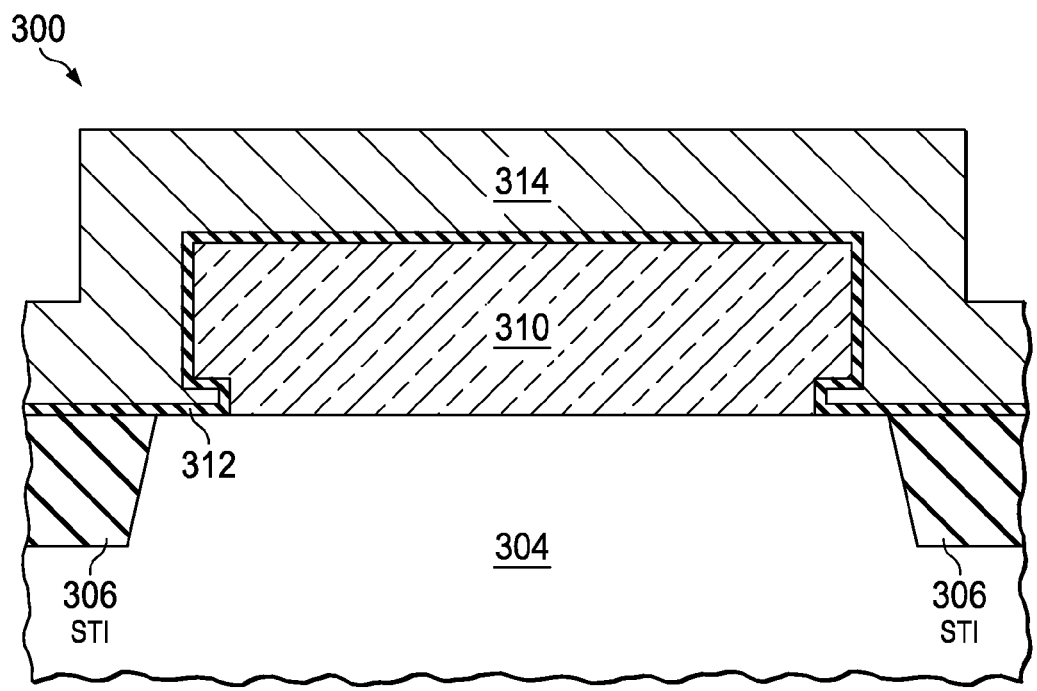
Figure 18C:
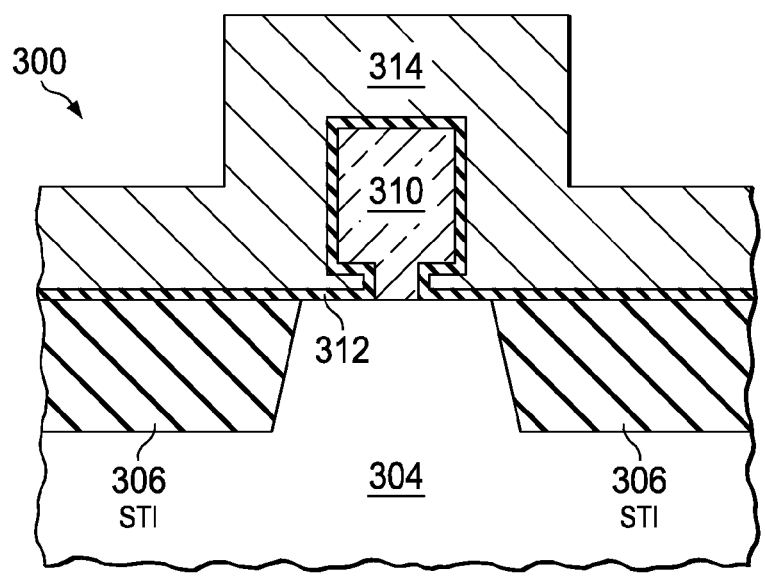
Figure 19A:
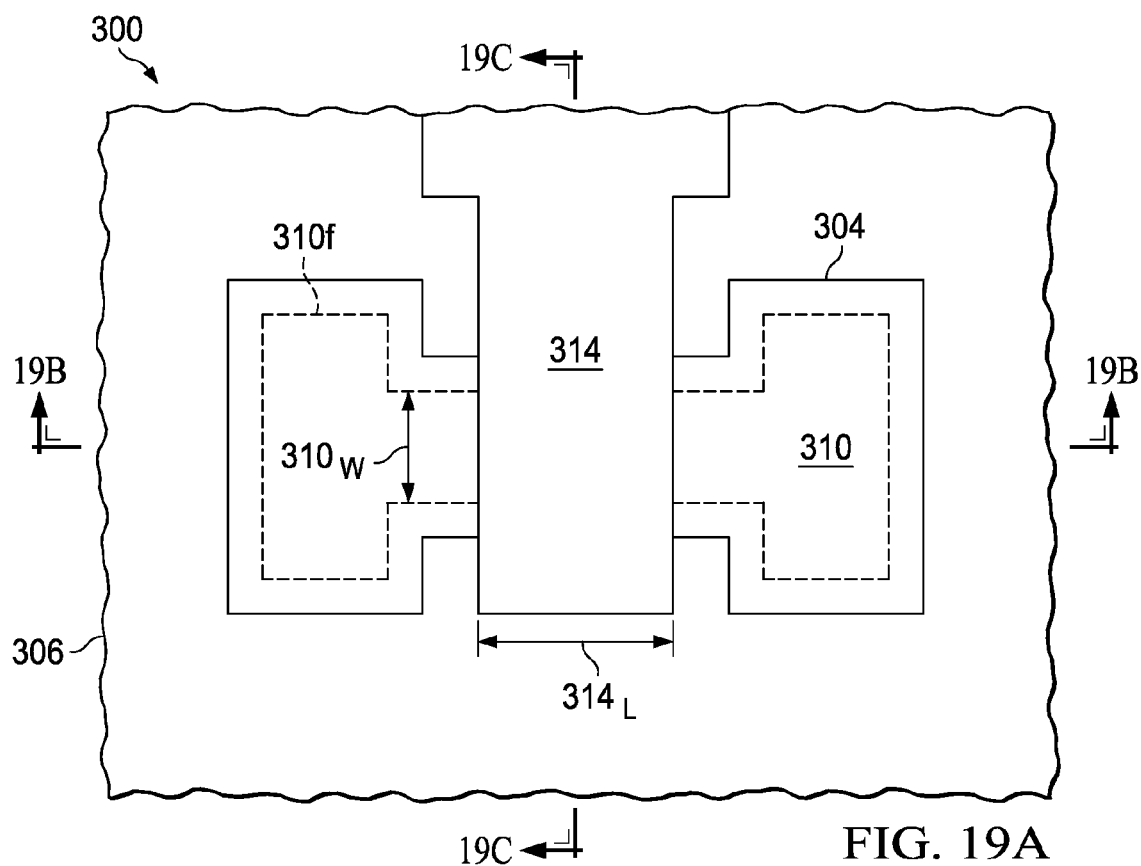
Figure 19B:
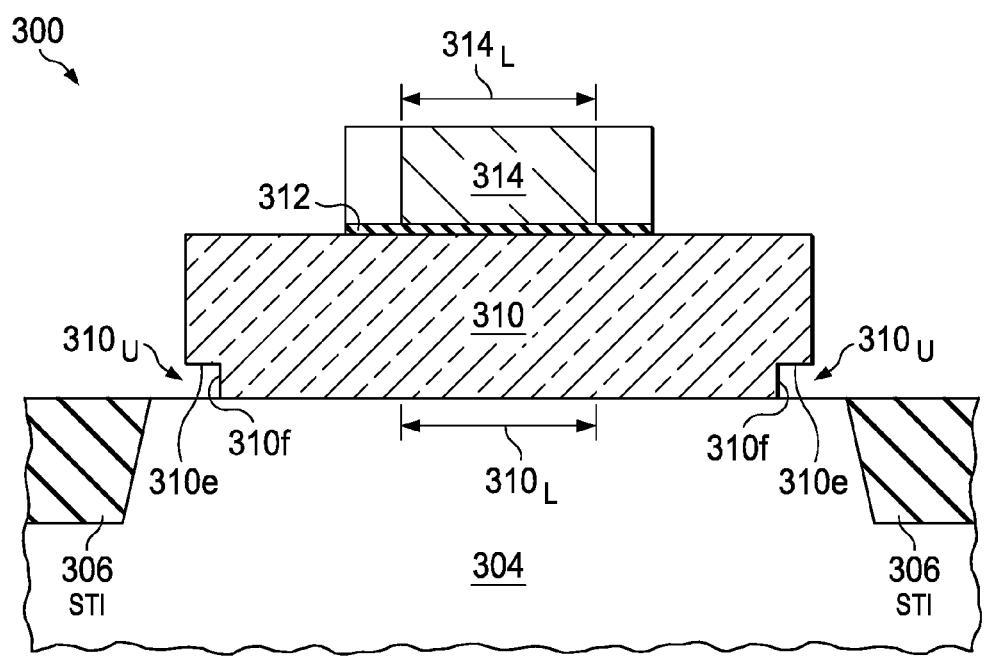
Figure 19C:
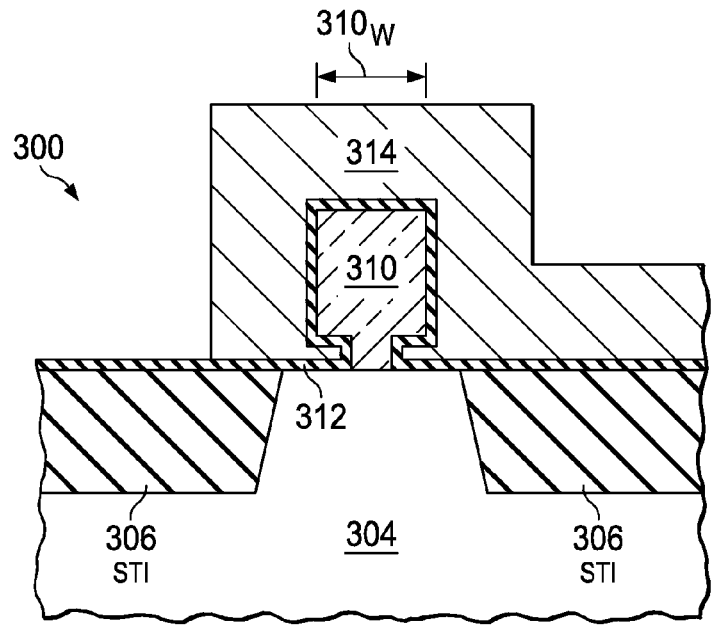

In FIGS. 18A-18C, a gate oxide 312 is formed over the semiconductor body 310 and a gate electrode material layer 314 (e.g., polysilicon, metal, or other suitable material) is deposited over the gate dielectric 312, wherein the gate layers 312 and 314 are also formed within the undercut area $310_U$. The gate is etched in FIGS. 19A-19C to remove portions of the gate electrode material 314 from the first and third body portions 310a and 310c, respectively, and from part of the second body portion 310b to leave a patterned gate structure having a gate length $314_L$ corresponding to the channel length $310_L$. In the illustrated example, the gate length $314_L$ roughly corresponds to the channel structure depth $310_D$ (e.g., about 25 nm or less in the exemplary device 300), and the semiconductor body $310_W$ is less than the gate length $314_L$.

Figure 20A:
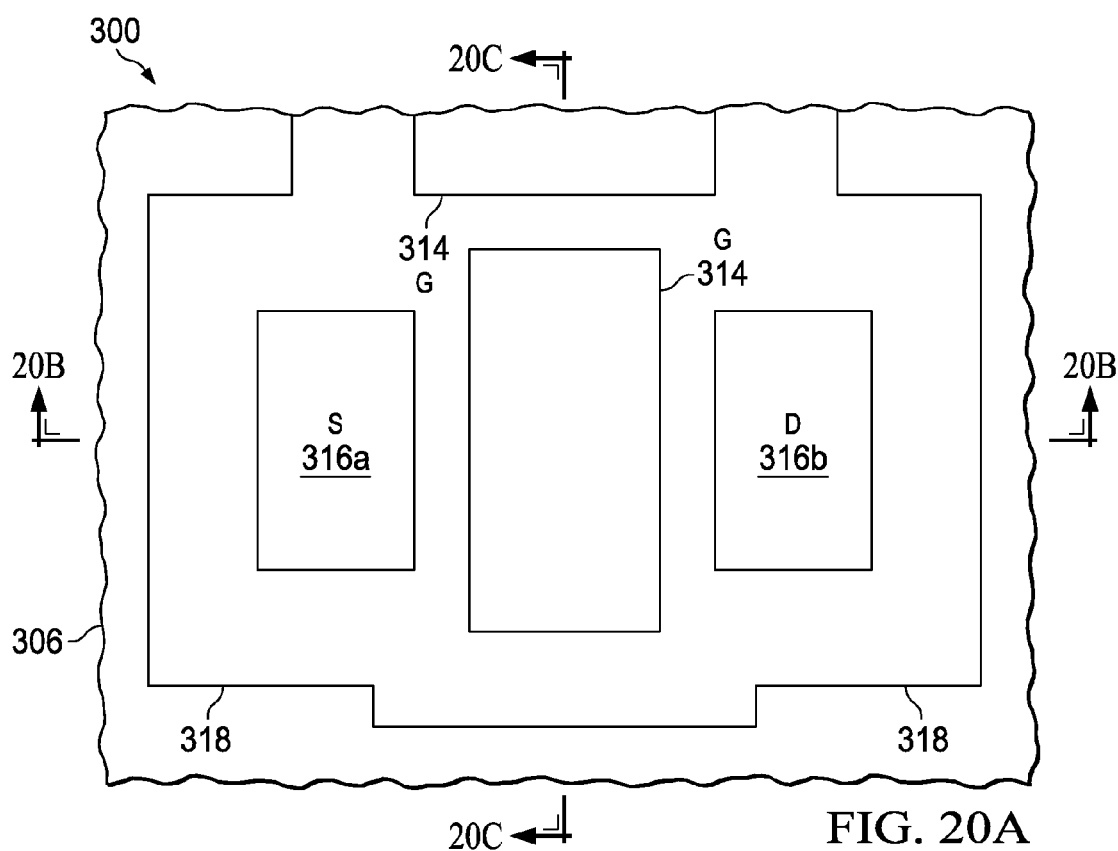
Figure 20B:
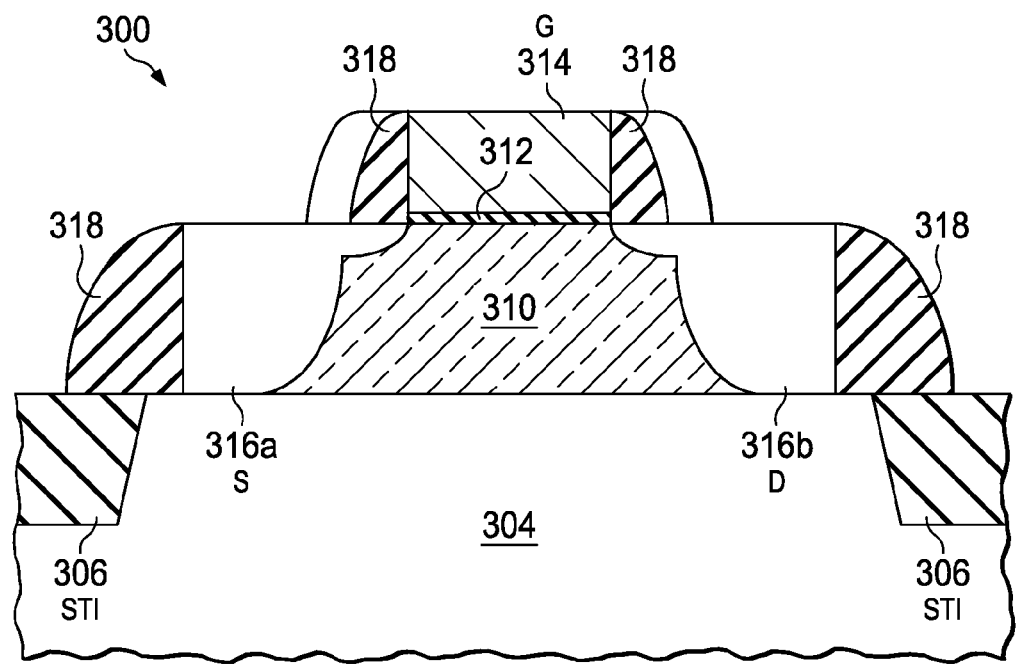
Figure 20C:
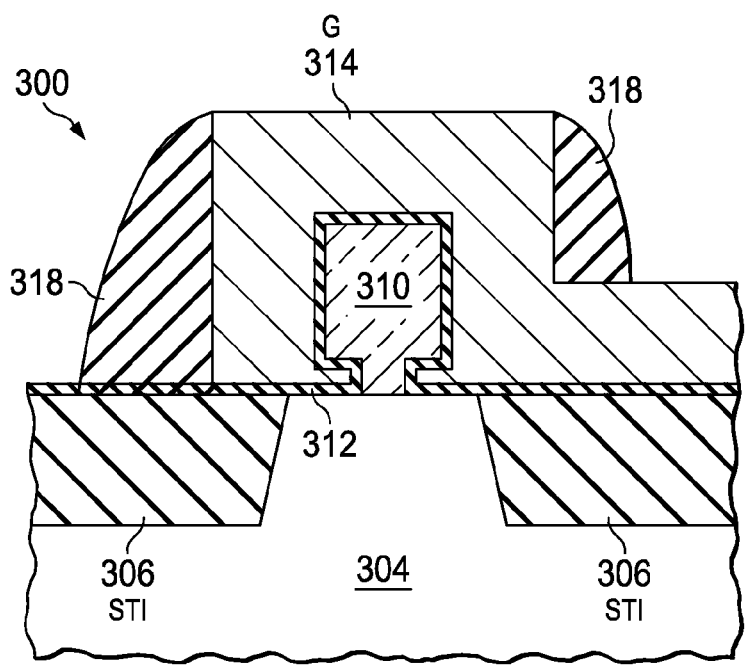
Figure 21A:
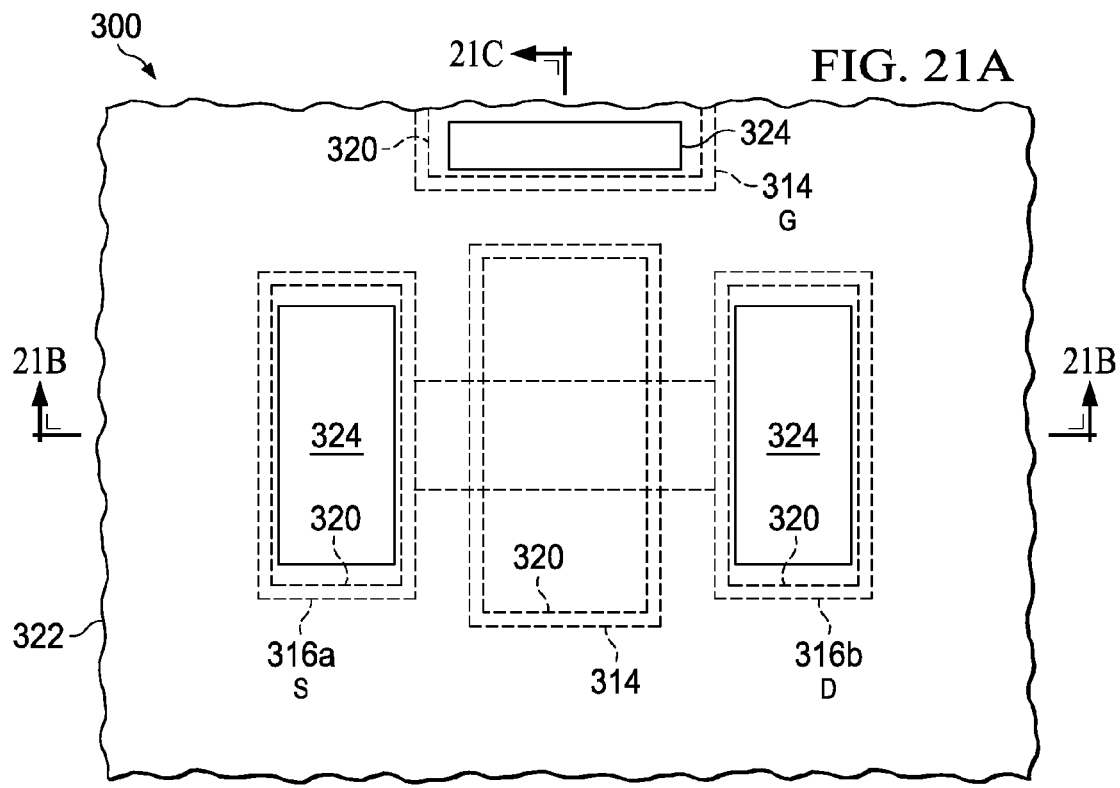
Figure 21B:
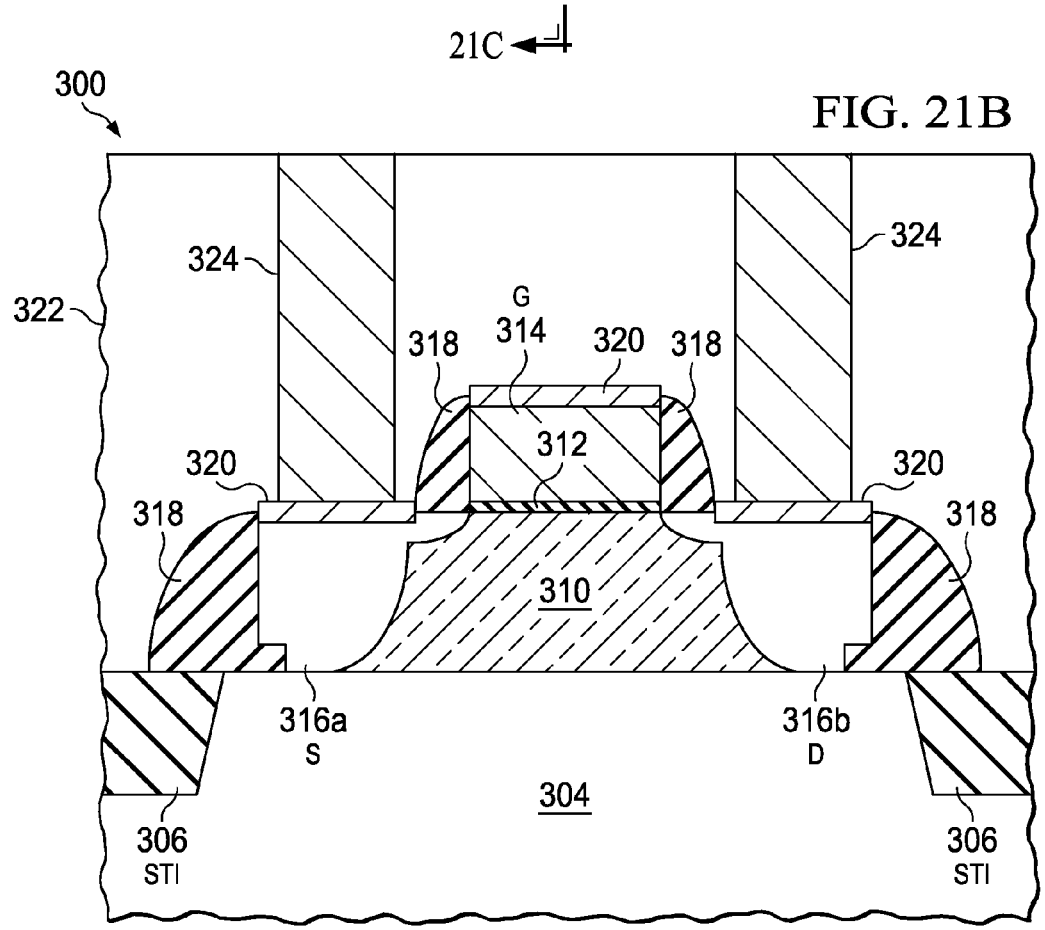
Figure 21C:
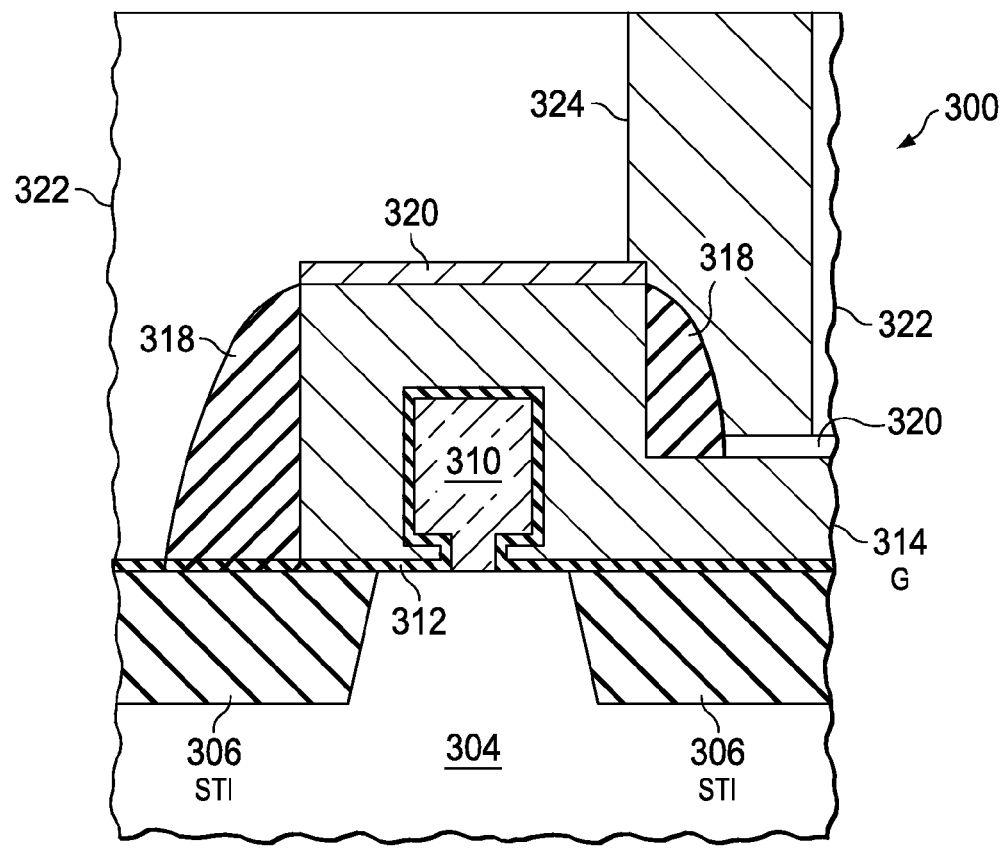

In FIGS. 20A-20C, source/drain regions 316a and 316b are doped with n or p-type dopant species in the first and third body portions 310a and 310b, respectively, wherein the source/drain 316a is indicated as a source "S" and the source/drain 316b is indicated as a drain "D" in the figures. The source/drains 316a and 316b are formed by a shallow drain extension dopant implantation to introduce dopants into source/drain regions 316, followed by formation of sidewall spacers 318 along the lateral sidewalls of the patterned gate structure (indicated as "G" in the figures). The source/drains 316a and 316b are then further defined by a source/drain implant to provide additional dopants thereto. A first metalization level is then constructed, as shown in FIGS. 21A-21C, including suicide contacts 320 formed over the patterned gate electrode 314 and the source/drains 316a and 316b. A pre-metal dielectric (PMD) 322 is then deposited and source, drain, and gate contacts 324 are formed through the PMD material 322, after which further metalization (interconnect) processing is performed to complete the device 300 (not shown).

The invention thus provides a multi-gate transistor comprising a formed semiconductor body including first, second, and third body portions with a generally planar first bottom surface overlying a starting structure, wherein the gate extends into the recess in the formed semiconductor body. This aspect of the invention may be employed in forming dual, triple, or quad-gate transistors, wherein the gate underlies a portion of the channel of the semiconductor body. Moreover, this L-shaped spacer/undercut semiconductor body approach may be employed alone or in combination with the lithography independent feature sizing aspects of the invention illustrated and described above to facilitate optimization of volume inversion and/or other performance parameters, even where the transistor is scaled to the minimum gate length achievable for a particular lithography technology.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transistor, comprising:
   a starting structure;
   a semiconductor body comprising first, second, and third body portions individually comprising a generally planar first bottom surface overlying said starting structure, the first and third body portions individually comprising doped source/drains, the second body portion comprising a top, first and second sides extending laterally between the first and third body portions, said second body portion having a lithography independent width smaller than a lithographically patterned gate length dimension between the first and second sides thereof; and
   a gate structure disposed along at least a portion of the top and sides of the second body portion, the gate structure comprising a conductive gate electrode and a gate dielectric disposed between the gate electrode and the second body portion.

2. The transistor of claim 1, wherein the first, second, and third body portions are disposed along an axis generally parallel to a plane of the starting structure.

3. The transistor of claim 1, wherein the starting structure comprises a semiconductor and wherein the semiconductor body comprises silicon, silicon germanium, germanium, or gallium arsenide.

4. The transistor of claim 1, wherein the semiconductor body comprises epitaxial silicon.

5. The transistor of claim 1, wherein the gate structure comprises a lateral gate length, and wherein the lithography independent width of the second body portion is less than the lateral gate length of the gate structure.

6. The transistor of claim 5, wherein the gate length is about 25 nm or less.

7. The transistor of claim 5, wherein the second body portion comprises a depth between the top and the generally planar bottom surface, and wherein the depth of the second body portion and the gate length are generally equal.

8. The transistor of claim 1, wherein the gate structure comprises a lateral gate length, and wherein the lithography independent width of the second body portion is less than one half of the lateral gate length of the gate structure.

9. The transistor of claim 8, wherein the lithography independent width of the second body portion is about one third of the lateral gate length of the gate structure.

* * * * *